(12) United States Patent
Walther et al.

(10) Patent No.: US 10,676,346 B2
(45) Date of Patent: Jun. 9, 2020

(54) MEMS COMPONENT AND PRODUCTION METHOD FOR A MEMS COMPONENT

(71) Applicant: Infineon Technologies AG, Neubiberg (DE)

(72) Inventors: Arnaud Walther, Unterhaching (DE); Alfons Dehe, Villingen Schwenningen (DE); Gerhard Metzger-Brueckl, Geisenfeld (DE); Johann Strasser, Schierling (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 23 days.

(21) Appl. No.: 16/136,986

(22) Filed: Sep. 20, 2018

(65) Prior Publication Data
US 2019/0092624 A1 Mar. 28, 2019

(30) Foreign Application Priority Data
Sep. 22, 2017 (DE) .......................... 10 2017 216 835

(51) Int. Cl.
*B81B 7/02* (2006.01)
*H04R 31/00* (2006.01)
*B81C 1/00* (2006.01)
*H04R 19/00* (2006.01)
*H04R 19/04* (2006.01)

(52) U.S. Cl.
CPC ............ *B81B 7/02* (2013.01); *B81C 1/00158* (2013.01); *B81C 1/00166* (2013.01); *H04R 19/005* (2013.01); *H04R 19/04* (2013.01); *H04R 31/00* (2013.01); *B81B 2201/0257* (2013.01); *B81B 2203/0127* (2013.01); *B81B 2203/0315* (2013.01); *B81B 2203/04* (2013.01); *H04R 2201/003* (2013.01)

(58) Field of Classification Search
None
See application file for complete search history.

(56) References Cited

U.S. PATENT DOCUMENTS

| 7,912,236 B2 * | 3/2011 | Dehe .................... H04R 19/005 381/175 |
| 9,181,080 B2 * | 11/2015 | Dehe .................... B81B 3/0021 |

(Continued)

*Primary Examiner* — J. E. Schoenholtz
(74) *Attorney, Agent, or Firm* — Slater Matsil, LLP

(57) ABSTRACT

A production method for a MEMS component includes providing a layer arrangement on a carrier substrate, where the layer arrangement includes a first and second layer structure. A sacrificial material is arranged in an intermediate region between the first and second layer structures, an etch stop structure extending between the first and second layer structures subdivides the intermediate region into an exposure region and an edge region laterally adjoining the exposure region, and at least one of the first layer structure or the second layer structure has access openings to the exposure region. The method further includes removing the sacrificial material from the exposure region through the access openings using an etching process to expose the exposure region. The etch stop structure provides a lateral delimitation for the etching process, and the sacrificial material present in the edge region provides a mechanical connection between the first and second layer structures.

25 Claims, 10 Drawing Sheets

(56) References Cited

U.S. PATENT DOCUMENTS

| | | | | |
|---|---|---|---|---|
| 2009/0124035 A1* | 5/2009 | Rey | ............... | B81C 1/00158 |
| | | | | 438/52 |
| 2010/0065930 A1* | 3/2010 | Nakatani | ............ | B81C 1/00476 |
| | | | | 257/415 |
| 2011/0215672 A1* | 9/2011 | Yamaoka | .............. | B81B 3/0072 |
| | | | | 310/300 |
| 2013/0089224 A1* | 4/2013 | Dehe | ............... | H04R 19/013 |
| | | | | 381/191 |

* cited by examiner

MEMS COMPONENT AND PRODUCTION METHOD FOR A MEMS COMPONENT

This application claims the benefit of German Application No. 102017216835.8, filed on Sep. 22, 2017, which application is hereby incorporated herein by reference in its entirety.

TECHNICAL FIELD

Exemplary embodiments relate to MEMS components and to a production method for MEMS components, such as e.g. MEMS pressure transducers, acoustic MEMS sensors or MEMS sound transducers in the form of MEMS microphones or MEMS loudspeakers. Exemplary embodiments relate to MEMS microphones, in particular, during the production of which an etch stop structure that laterally delimits the etching process is used for defining the exposure region or air gap between two layer structures, such as e.g. between a membrane and a counterelectrode.

BACKGROUND

Acoustic MEMS sensors, such as e.g. MEMS microphones, are open components and exposed to the surrounding environment in a manner governed by their function, in order to detect e.g. sound pressure changes in the environment. Therefore, such MEMS sensors are often also subjected to harsh environmental conditions, such as e.g. mechanical loads, impacts and also high sound pressures. In order to prevent a malfunction or a reduced performance of acoustic MEMS sensors, the mechanically movable elements, in particular, should have a sufficient mechanical robustness to maintain the required functionality during the lifetime within the application, e.g. within mobile devices such as smartphones, notebooks, etc.

SUMMARY

A production method for a MEMS component comprises the following steps: providing a layer arrangement on a carrier substrate, where the layer arrangement comprises a first and second layer structure where a sacrificial material is arranged in an intermediate region between the first and second layer structures where an etch stop structure extending between the first and second layer structures subdivides the intermediate region into an exposure region and a edge region laterally adjoining the latter, and where at least one of the layer structures has access openings to the exposure region, and removing the sacrificial material from the exposure region through the access openings by means of an etching process in order to expose the exposure region, where the etch stop structure is effective as lateral delimitation for the etching process, and where the sacrificial material present in the edge region is effective for mechanical connection between the first and second layer structures.

A MEMS component comprises a layer arrangement on a carrier substrate, where the layer arrangement comprises a first and second layer structure, where an exposure region is exposed between the first and second layer structures, where a sacrificial material is arranged in an edge region between the first and second layer structures, where an etchant-resistant wall structure extending between the first and second layer structures demarcates the exposure region from the edge region laterally adjoining the latter, and where the insulation material present in the edge region is effective for mechanical connection between the first and second layer structures.

BRIEF DESCRIPTION OF THE DRAWINGS

Exemplary embodiments of devices and/or methods are described in greater detail below by way of example with reference to the accompanying figures, in which.

DETAILED DESCRIPTION OF ILLUSTRATIVE EMBODIMENTS

Figure 1A:
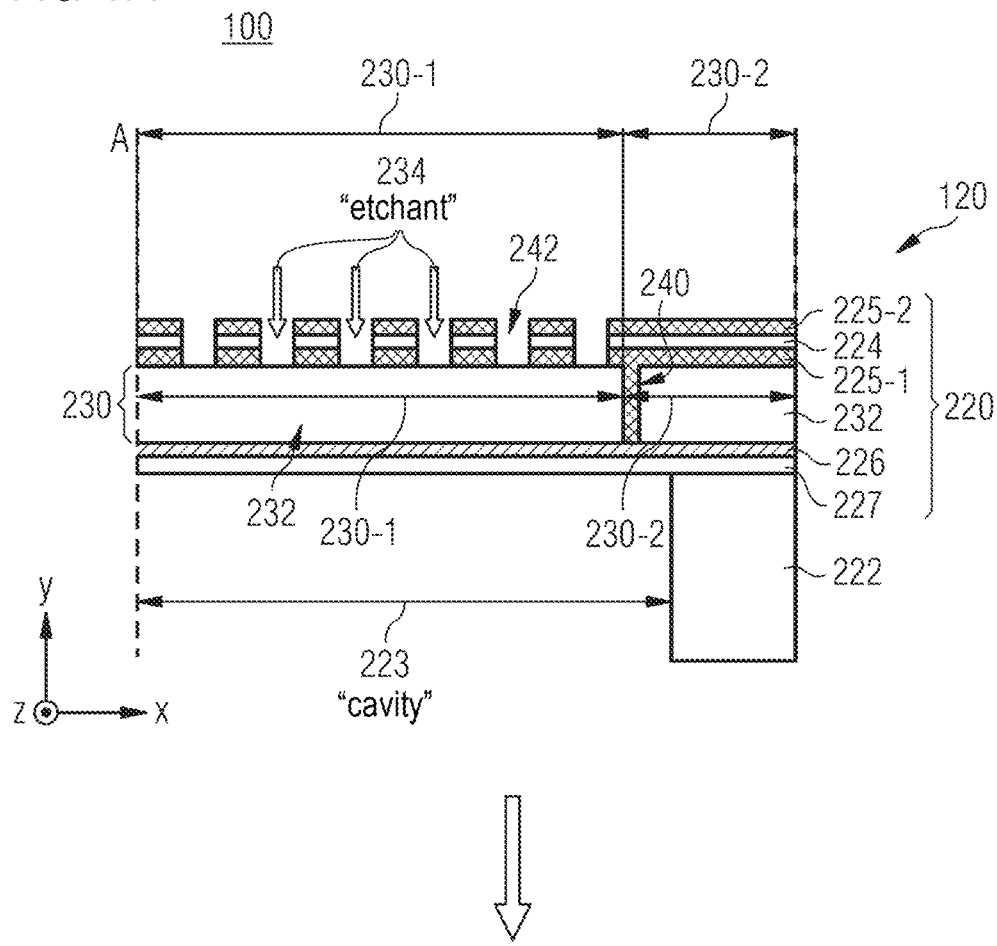
FIGS. 1a-1b show an exemplary method for producing a MEMS component in a two-layer arrangement in accordance with one exemplary embodiment.

Before exemplary embodiments of the present invention are explained in more specific detail below with reference to the drawings, it is pointed out that identical, functionally identical or identically acting elements, objects, function blocks and/or method steps in the various figures are provided with the same reference signs, such that the description of said elements, objects, function blocks and/or method steps that is presented in various exemplary embodiments is mutually interchangeable or can be applied to one another.

MEMS components, such as e.g. MEMS microphones, are formed for example from a sequence of layers or layer structures, where the different layers can comprise in each case e.g. poly- or monocrystalline silicon, silicon nitride or silicon oxide. The silicon oxide material is then used for example as material for the sacrificial layer, where the sacrificial layer material is then removed from a defined exposure region at the end of the process for producing the MEMS component using an etchant in order to obtain the cleared exposure region or air gap. In accordance with the present concept, a "vertical" wall or wall structure is then arranged between two adjacent layer structures, such as e.g. a membrane structure and a counterelectrode structure, of the MEMS microphone. In this case, "vertical" means an orientation orthogonal to the lateral extension direction of the first and second layer structures.

During the etching-free process, i.e. during the process of removing the sacrificial material from the exposure region, the wall structure is then effective as lateral delimitation for the etching process, with the result that the edge of the exposure region that arises during the etching process can be defined exactly. The process of exposing the exposure region is also referred to as release process or release etching. The use of a vertically formed etch stop structure thus makes it possible to obtain a defined and smooth exposure or release edge of the exposure region between the two adjacent layer structures.

The etch stop structure thus enables a definition of the lateral etching profile of the sacrificial layer, whereby the acoustic and also mechanical properties of the MEMS component and in particular the mechanical robustness can be significantly improved. In this regard, the mechanical robustness can also be formed asymmetrically between front and rear sides of a MEMS microphone.

The presented procedure for producing a MEMS component, e.g. a MEMS microphone, can be incorporated into the production process for MEMS components without high additional outlay since in particular the process of forming the etch stop structure(s) in the form of a vertical wall structure configured in wall-shaped fashion between two adjacent layer structures, i.e. for example in each case between the membrane and the associated counterelectrode of the MEMS component, can be integrated extremely easily into previous process sequences for producing MEMS components.

The present concept thus makes it possible substantially to use proven designs for MEMS components, while the restrictions for the technological process can be eased or simplified in order to improve the mechanical and acoustic robustness of the MEMS microphones. The robustness of the MEMS microphones can be taken into account for example in the course of accommodating same in a housing, since the present concept affords the possibility of adapting an "asymmetry" of the mechanical robustness to the respective type of housing. In this regard, for example in the case of a MEMS microphone having a sound port arranged at the "underside", which is also referred to as a "bottom port microphone", a higher mechanical robustness of the MEMS component can be provided at the side assigned to the sound opening. In this sense the present concept thus also relates to the system level of MEMS microphones.

In particular, the present concept enables a greater flexibility for the design of the MEMS component, where for example also by means of a correspondingly configured, additional etch stop structure a middle or central anchoring of the membrane with the counterelectrode is maintained by a further remaining sacrificial material region within the rest of the exposure region, whereby a further system optimization can be obtained.

To summarize, it can thus be stated that, in accordance with exemplary embodiments, a well-defined and smooth exposure edge may be obtained at the edge of the exposure region by means of the etch stop structure, whereby the mechanical and acoustic robustness of the resulting MEMS microphone may be increased and also set in a targeted manner. Accordingly, in some embodiments, MEMS a component, such as e.g. an acoustic MEMS sensor or a MEMS microphone may be produced according to embodiment MEMS productions methods to have excellent acoustic behavior and, also at the same time, have a high mechanical robustness.

The basic sequence of the method for producing a MEMS component in accordance with an exemplary embodiment is now presented below with reference to schematic illustrations in FIGS. 1 to 9. In order to simplify the description of the geometric relationships, an x-y-z-coordinate system is furthermore illustrated by way of example in the figures, wherein the x-y-plane represents the plane of the drawing.

As is illustrated in FIG. 1a, in the production method 100 for a MEMS component 200, a step 120 involves providing a layer arrangement 220 on a carrier substrate 222, such as e.g. a semiconductor substrate. The layer arrangement 220 comprises a first layer structure 224, e.g. a static counterelectrode structure, and furthermore a second layer structure 226, e.g. a membrane structure that is movable in the exposed state. A sacrificial material 232 is arranged in an intermediate region 230 between the first and second layer structures 224, 226. Furthermore, an etch stop structure 240 is formed in the intermediate region 230 between the first and second layer structures 224, 226, said etch stop structure extending for example in wall-shaped fashion and vertically between the first and second layer structures 224, 226 in the intermediate region 230. The etch stop structure 240, which is effective as lateral delimitation for a subsequent etching or removing process step, thus subdivides the intermediate region 230 into an exposure region 230-1 and an edge region 230-2 laterally adjoining the latter. Furthermore, access openings 242 to the exposure region 230-1 are provided in at least one of the layer structures 224, 226.

As is illustrated in FIG. 1a, the access openings 242 can be arranged for example in the first layer structure 224, e.g. the counterelectrode structure, wherein the access openings can also be provided alternatively or additionally in the second layer structure 226, e.g. the membrane structure. The etch stop structure 240 comprises for example a material that is etchant-resistant during a subsequent step of removing, e.g. step of etching, the sacrificial material 232 from the exposure region 230-1.

As is furthermore illustrated in FIG. 1a, a first and second insulation layer 225-1, 225-2 can optionally be arranged on both sides of the first layer structure 224 along the x-z-plane. In this case, the insulation layer 225-1 can comprise the same material as the etch stop structure 240. An insulation layer 227 can furthermore be applied on a surface region of the second layer structure 226, said insulation layer thus being situated between the second layer structure 226 and the carrier 222. The insulation layer 227 can comprise for example the same material as the sacrificial material 232. A cavity 223 arranged in the carrier 222 is furthermore illustrated in FIG. 1a.

As becomes clear from the schematic illustration of the layer arrangement 220 in FIG. 1a, the layer arrangement 220 is illustrated proceeding from the edge region 230-2 and the adjoining intermediate region 230-1 as far as the plane A, which is arranged parallel to the y-z-plane in FIG. 1a and represents for example a plane of symmetry for the layer arrangement 220 arranged on the carrier substrate 222. The layer arrangement 220 arranged on the carrier substrate 222 as illustrated in Figure is thus extends (corresponding to a mirroring at the plane A) as far as the opposite edge region 230-2. Equally, in accordance with exemplary embodiments, the plane of the drawing (x-y-plane) can also be regarded as a plane of symmetry insofar as Figure is illustrates a central partial sectional view through the layer arrangement 220 arranged on the carrier substrate 222.

Figure 1B:
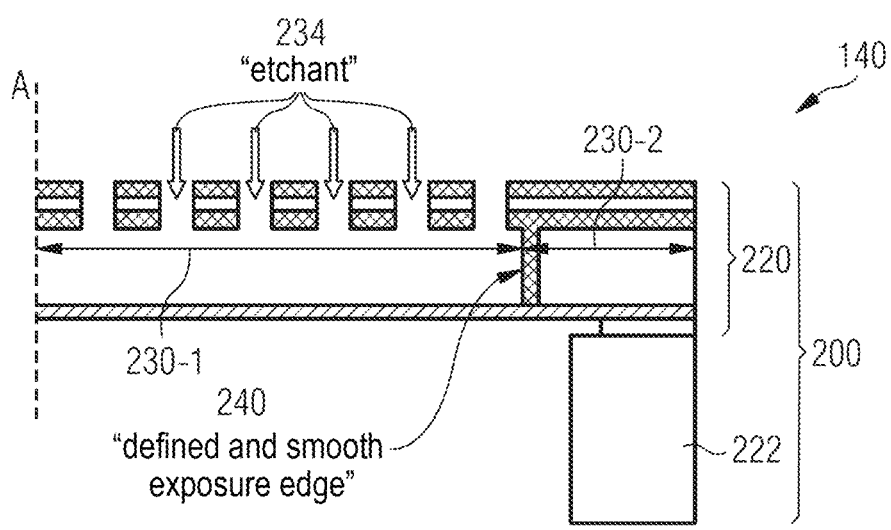

FIG. 1b then illustrates the step of removing the sacrificial material 232 from the exposure region 230-1 through the access openings 242 by means of an etchant 234 in order to clear the exposure region 230-1 of the intermediate region 230. During the etching process, the etch stop structure 240 is effective as a lateral delimitation for the etchant 234, wherein the sacrificial material 232 remaining in the edge region 230-2 is effective for mechanical connection or coupling of the first and second layer structures 224, 226.

Furthermore, the material of the insulation layer 227 that adjoins the cavity 223 can be removed during the etching process, wherein the insulation material 227 remaining in the edge region 230-2 is effective for mechanical connection or coupling between the second layer structure 226 and the carrier 222.

Since the etch stop structure 240 comprises a material, e.g. a nitride material, which is resistant to the etchant 234 used during the etching process, a defined and smooth exposure edge of the exposure region 230-1 adjoining the edge region 230-2 is obtained during the etching process.

In accordance with one exemplary embodiment, the etch stop structure 240 is configured as a circumferential wall structure around the exposure region 230-1 between the first and second layer structures 224, 226. The etch stop structure 240 can for example be circular, square, rectangular, or have any shape of a polygon progression. In accordance with exemplary embodiments, the etch stop structure 240 is arranged in a manner offset inward from the outer edge of the layer arrangement 220 in a manner corresponding to width of the edge region 230-2 and thus follows for example the outer contour of the layer structures 224, 226 of the MEMS component 200. The etch stop structure 240 can be configured for example as an uninterrupted, continuous edge region, wherein in accordance with further exemplary embodiments relatively small discontinuities or interruptions of the circumferential edge region can also be provided, for example if one of the layer structures 224, 226 has a segmentation (not shown in FIGS. 1a-1b).

In accordance with one exemplary embodiment, the layer arrangement 220 can furthermore comprise an additional etch stop structure (not shown in FIGS. 1a-b) extending between the first and second layer structures 224, 226. The additional etch stop structure, in a central region of the layer arrangement 220, for example, can define a mechanical connection structure between the first and second layer structures after the etching process by maintaining sacrificial material 232. A mechanical connection structure between the first and second layer structures 224, 226 can thus be obtained. Furthermore, the additional etch stop structure can be provided in order to form a so-called ventilation opening through the layer arrangement 220.

An exemplary sequence of optional process steps by means of which the layer arrangement 220 present in the step of providing 120 can be obtained is discussed hereinafter. In accordance with one exemplary embodiment, the basic method steps presented below can be carried out for example before the step of providing 120 the layer arrangement 220. In this regard, firstly the second layer structure 226 can be formed or applied in the form of a layer or a layer stack on the carrier substrate 222, wherein for example the insulation layer 227 is arranged on the carrier substrate 222 and is formed between the first layer structure 226 and the carrier substrate 222. Applying the second layer structure 226 can be carried out for example by means of a depositing process.

Afterward, the sacrificial material 232 is applied on the second layer structure 226, whereupon, for example, a circumferential through opening is introduced into the sacrificial material 232, e.g. in the form of a negative mold of the etch stop structure 240 to be formed, as far as the second layer structure 226. If the intention is to form an additional etch stop structure, e.g. for a mechanical connection element into a central region of the layer arrangement 220, it is correspondingly possible furthermore to form an additional, circumferential through opening in the sacrificial material 232. Afterward, the etch stop structure 240 in the circumferential through opening and optionally one or more additional etch stop structures in the one or more additional circumferential through openings are formed by introducing a filling material structure that is resistant to the etching process into the respective circumferential through opening.

Afterward, the first layer structure 224 is formed, i.e. applied and if appropriate structured, in the form of a layer or a layer stack on the sacrificial material 232 and the etch stop structure 240 or the additional etch stop structure(s). The sacrificial material 232 and the etch stop structure 240 are thus situated in the intermediate region 230 between the first and second layer structures 224, 226.

In further optional process steps (not shown in FIGS. 1a-1b), in accordance with exemplary embodiments, further elements of the MEMS component, such as, for example, contact structures for the first and second layer structures 224, 226, intermediate layers, insulation layers, insulation layers with embedded conductor tracks and/or else passivation layers can furthermore be provided.

As is illustrated in FIGS. 1a-1b, the first layer structure 224 can furthermore be embedded into the two insulation layers 225-1, 225-2. In this regard, during the process of forming the etch stop structure 240, for example, the etch stop structure 240 can be formed together with forming the insulation layer 225-1 and comprise the same material, e.g. an etchant-resistant nitride material. Consequently, a nitride material can be used as an etchant-resistant material for the etch stop structure 240 and for the further layers 225-1-2. Furthermore, by way of example, other etchant-resistant materials, such as e.g. $Al_2O_3$, SiC, etc., can also be used.

Further intermediate layers can be provided for example for anchoring the first and second layer structures, while conductor tracks (not shown in FIGS. 1a-1b) embedded in insulation layers can be provided for electrical contacting. A final passivation layer 225-2 can be provided e.g. as a protective layer.

Furthermore, the cavity 223 can be formed for example by a further etching process, e.g. a Bosch etching process, in the carrier substrate or semiconductor substrate 222, in order to expose at least the movable section of the second layer structure 226, which is configured for example as a membrane.

In accordance with one exemplary embodiment, the sacrificial layer can comprise an oxide material, such as e.g. silicon oxide. In accordance with one exemplary embodiment, the first and second layer structures 224, 226 can comprise a semiconductor material, such as e.g. polycrystalline or monocrystalline silicon.

Step 140 of removing the sacrificial material 232 in the exposure region 230-1 of the intermediate region 230 can be carried out for example by means of an anisotropic etching process using an etchant, wherein the etchant has an etching rate which is higher for the sacrificial material 232 than for the material of the etch stop structure 240 or the additional etch stop structure at least by a factor of 10. Exemplary etchants for an anisotropic wet etching process can comprise liquid HF-based etching solutions (HF=hydrofluoric acid) such as e.g. $HNO_3$+HF, etc.

As further exemplary sacrificial layer materials it is also possible to use PSG/BPSG materials (PSG=phosphosilicate glass, and BPSG=borophosphosilicate glass), wherein liquid HF-based etching solutions can also be used for the latter.

Carbon is furthermore conceivable as sacrificial material 232, wherein oxygen can be used as etchant 234 in order to ash the carbon arranged as sacrificial material 232.

In accordance with one exemplary embodiment, the filling material of the etch stop structure 240 can comprise for example a nitride material, e.g. the material of the insulation layer 225-1, as shown in FIGS. 1a-1b, or a silicon material, e.g. the material of the layer structure 224, or else a combination of the nitride material of the insulation layer 225-1 and the silicon material of the first layer structure 224.

Consequently, in accordance with one exemplary embodiment, the etch stop structure 240 can be formed by introducing a single layer or else a layer sequence composed of a plurality of filling materials into the circumferential through opening. In the case of the layer sequence composed of a plurality of filling materials that is to be introduced in the circumferential through opening, for example the outermost layer subjected to the etchant 234 during the exposure or etching step can comprise the etchant-resistant material.

In accordance with one exemplary embodiment, the etch stop structure 240 is formed from an electrically insulating material. In accordance with a further exemplary embodiment, the etch stop structure 240 can also be formed from an electrically conductive material in order to produce an electrical connection at least between sections of the first and second layer structures 224, 226. By way of example, if at least one of the two layer structures 224, 226 has a segmentation (not shown in FIGS. 1a-1b), the etch stop structure 240 configured in conductive fashion can be arranged within the segmentation, i.e. proceeding from the edge region of the layer arrangement 220 on that side of the segmentation which is assigned to the central region of the layer arrangement 220.

As has already been indicated above, in accordance with one exemplary embodiment, an additional through opening (not shown in FIGS. 1a-1b), can be introduced into the sacrificial material 232 as far as the second layer structure in order then subsequently to form an additional etch stop structure (not shown in FIGS. 1a-1b) in the additional through opening by an additional filling material structure, which is resistant to the etching process, being introduced into the additional through opening. The additional etch stop structure can form for example a mechanical connection element between the first and second layer structures 224, 226.

In accordance with one exemplary embodiment, the first layer structure 224 can be configured as an e.g. rigid counterelectrode structure (backplate) of the MEMS component, wherein the second layer structure 226 is configured as a deflectable membrane structure.

In accordance with an alternative exemplary embodiment, the first layer structure 224 can be configured as a deflectable membrane structure, wherein the second layer structure can be configured as an e.g. rigid counterelectrode structure.

In accordance with exemplary embodiments, a MEMS microphone comprises at least one movable membrane and at least one static counterelectrode, which is also referred to as backplate. The movable membrane and the counterelectrode are separated from one another by means of an air gap, wherein the membrane and the counterelectrode are arranged on a substrate or carrier provided with a cavity. The resulting air gap is defined by a sacrificial layer material that is removed by means of an etching process. The lateral etching process for the sacrificial layer material is then delimited by the etch stop structure configured as a vertical wall between the membrane and the counterelectrode.

By forming the wall-shaped, circumferential etch stop structure it is possible to set the exposure region exactly, as a result of which in turn the compliance or flexibility of the membrane can be set exactly to a desired value. Furthermore, lateral irregularities of the exposure edge or of the etching edge can be avoided, which can otherwise occur if, during an etching process using the etchant, the sacrificial layer material is removed from the exposure region through the exposure openings in the membrane and/or the counterelectrode. By virtue of the defined, smooth, circumferential etch stop structure, it is possible to avoid mechanical weak points at the edge region or securing region between membrane and counterelectrode, since undesired roughnesses and irregularities of the exposure edge are avoided. It is thus possible to prevent so-called "mechanical hot spots", i.e. regions with very high mechanical loadings, from occurring if a significant mechanical load acts on the membrane.

The etch stop structure laterally delimiting the etching process thus enables a defined formation of the edge region of the MEMS component and thus a defined anchoring of the membrane and the counterelectrode at the edge region of the MEMS component, as a result of which variations or fluctuations of the mechanical properties of the membrane can be significantly reduced. In particular, the defined, smooth exposure edge or the exposure boundary significantly improves the mechanical robustness of the MEMS component. In the case of a MEMS microphone having two air gaps, the relative positioning of the two exposure margins or exposure edges can furthermore be set in a simple manner by means of a corresponding design of adaptation. As a result, it is possible to set for example the direction in which the MEMS microphone has a greater mechanical robustness.

In this regard, that side of a MEMS microphone which is also subjected to the higher mechanical loadings during operation can be formed with a higher mechanical robustness. In general terms this means that for example that side of the MEMS microphone which faces the sound opening of the MEMS microphone can be designed with a higher mechanical robustness.

A description will now be given hereinafter, with reference to FIGS. 2a-2e, of the exemplary method 100 for producing a MEMS component 200 in a two-layer arrangement 224, 226 with various configurations of the layer arrangements 220 and designs of the etch stop structure 240.

In order to simplify the description, the sacrificial material 232, which is still present in the layer arrangement 220 in step 120 and is removed in step 140, is illustrated in a hatched manner in FIGS. 2a-2e. Apart from the configuration of the filling material or filling materials of the etch stop structure 240 in FIGS. 2a-2e, the explanations in respect of FIGS. 1a-1b are once again correspondingly applicable here. In the case of the layer arrangement 220 illustrated in FIGS. 2a-2e, a segmentation can be provided in the first or second conductive layer structure 224, 226, this being illustrated by way of example in FIGS. 2c-2d.

As becomes clear from the schematic illustration of the layer arrangement 220 in FIGS. 2a-2e, the layer arrangement 220 is illustrated proceeding from the edge region 230-2 and the adjoining intermediate region 230-1 as far as the plane A, which is arranged parallel to the y-z-plane in FIGS. 2a-2e and represents for example a plane of symmetry for the layer arrangement 220 arranged on the carrier substrate 222.

Figure 2A:
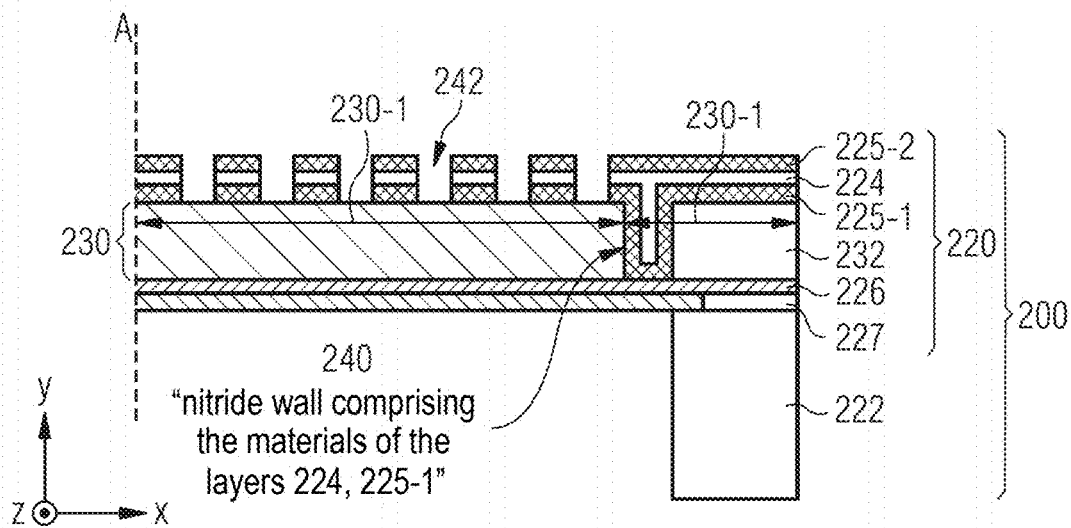
FIGS. 2a-2e show exemplary methods for producing a MEMS component with different two-layer arrangements in accordance with further exemplary embodiments.

As is illustrated in FIG. 2a, the etch stop structure 240 comprises an outer etchant-resistant layer e.g. composed of the material of the insulation layer 225-1, e.g. composed of a nitride material, and also an inner layer composed of the material of the first layer structure 224, such as e.g. a polycrystalline or monocrystalline silicon material. Step 140 of removing the sacrificial material 232 involves removing again the sacrificial material 232 situated in the exposure region 230-1 between the first and second layer structures 224, 226. Furthermore, the exposed sections of the intermediate layer 227 can be removed.

Figure 2B:
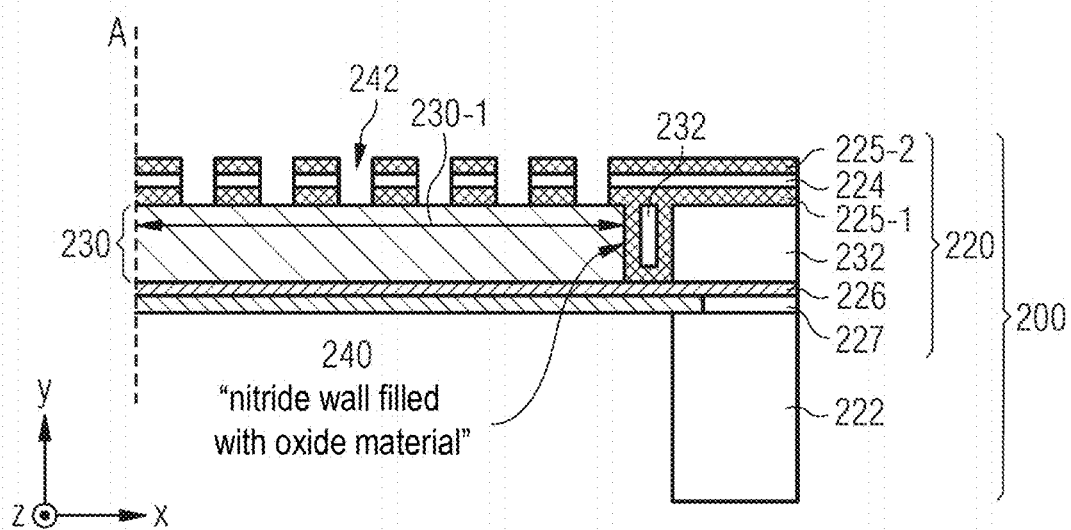

In the case of the configuration of the etch stop structure 240 as illustrated in FIG. 2b, the etch stop structure 240 comprises a layer sequence composed of an outer etchant-resistant layer, e.g. composed of the material of the insulation layer 225-1, e.g. comprising a nitride material, and also a layer embedded therein and composed e.g. of the material of the sacrificial material layer 234, e.g. an oxide material. The nitride material wall is thus filled for example with an oxide material, e.g. the material of the sacrificial layer 232, wherein the wall material is arranged such that only the latter is subjected to the etchant 234 taking effect during the process of removing 140 the sacrificial material 232. Step 140 of removing the sacrificial material 232 involves removing again the sacrificial material 232 situated in the exposure region 230-1 between the first and second layer structures 224, 226. Furthermore, the exposed sections of the intermediate layer 227 can be removed.

Figure 2C:
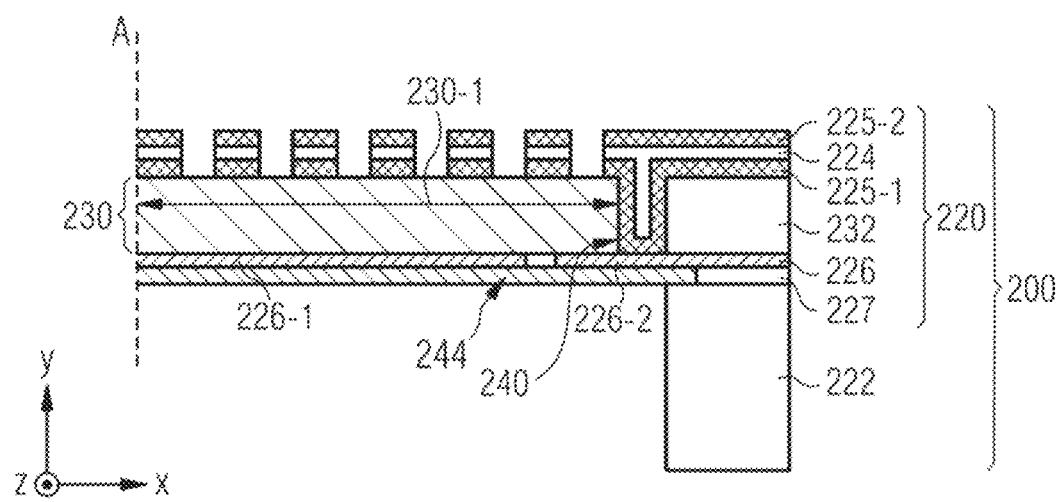

As is illustrated in FIG. 2C, the second layer structure 226, which is configured for example as a movable membrane, has a segmentation 244. A segmentation 244 of the second layer structure 226 that is formed with an insulation material yields an electrical insulation or isolation between a first inner section 226-1 and a second, outer section 226-2 of the conductive second layer structure 226. The segmentation 244 of the conductive second layer structure 226 configured as a membrane, for example, has the goal of reducing parasitic capacitances for example between the first and second conductive layer structures 224, 226, that is to say that the proportion of the useful capacitance is intended to be increased relative to the parasitic capacitance of the MEMS component 200 and the signal-to-noise ratio (SNR) of the MEMS component is thus intended to be improved.

The segmentation 244 of the second layer structure 226 can be arranged for example in order to provide an electrical isolation between the active or deflectable section 226-1 and the substantially inactive, non-deflectable section 226-2 of the second layer structure 226 configured as a membrane. The segmentation can be realized for example as a circumferential narrow trench or a circumferential narrow cutout which is filled with an insulating material and electrically isolates the first and second sections 226-1, 226-2 of the second conductive layer structure 226 from one another, but keeps them mechanically connected to one another.

As is illustrated in FIG. 2c, the etch stop structure 240 comprises an outer etchant-resistant layer e.g. composed of the material of the insulation layer 225-1, e.g. composed of a nitride material, and also an inner layer composed of the material of the first layer structure 224, such as e.g. a polycrystalline or monocrystalline silicon material. Step 140 of removing the sacrificial material 232 involves removing again the sacrificial material 232 situated in the exposure region 230-1 between the first and second layer structures 224, 226. Furthermore, the exposed sections of the intermediate layer 227 can be removed.

Figure 2D:
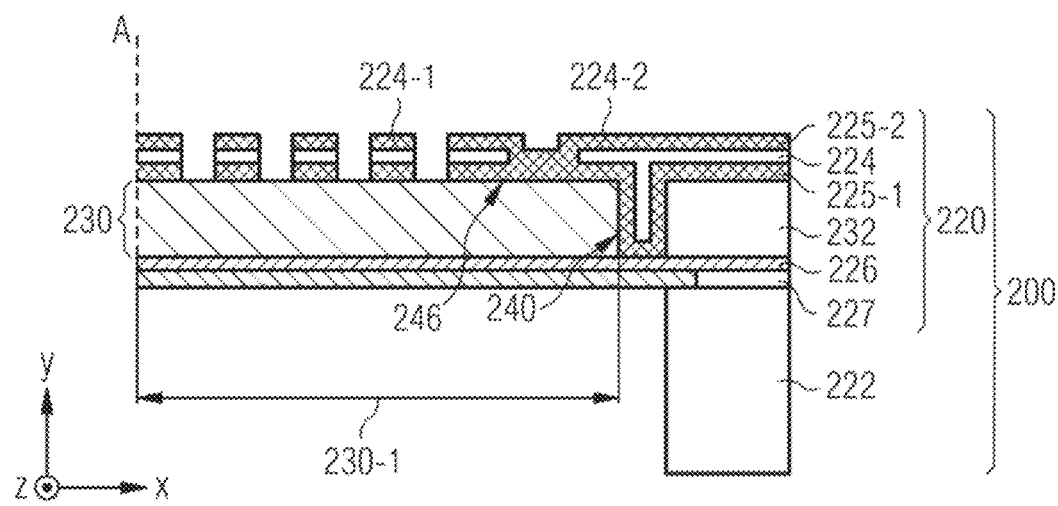

The exemplary embodiment of a layer arrangement 220 on the carrier substrate 222 as illustrated in FIG. 2d differs from the arrangement illustrated in FIG. 2c in that here the segmentation is formed in the first conductive layer structure 224, i.e. a segmentation 246 of the first conductive layer structure 224 configured for example as a counterelectrode is formed. The segmentation 246 of the first layer structure 226 is once again provided in order to provide an electrical isolation of a first, inner section 224-1 and a second, outer section 224-2 of the first layer structure 224, wherein a mechanical connection between the inner and outer sections 224-1, 224-2 of the first layer structure 224 is maintained, however, by the insulation material used, which is provided for example by the material of the two layers 225-1, 225-2. As is once again illustrated in FIG. 2d, it is possible to use the filling material structure of the etch stop structure 240 once again comprising the materials of the first layer structure 224 with the surrounding insulation layers 225-1, 225-2.

As is illustrated in FIG. 2d, the etch stop structure 240 comprises an outer etchant-resistant layer e.g. composed of the material of the insulation layer 225-1, e.g. composed of a nitride material, and also an inner layer composed of the material of the first layer structure 224, such as e.g. a polycrystalline or monocrystalline silicon material. Step 140 of removing the sacrificial material 232 involves removing again the sacrificial material 232 situated in the exposure region 230-1 between the first and second layer structures 224, 226. Furthermore, the exposed sections of the intermediate layer 227 can be removed.

Figure 2E:
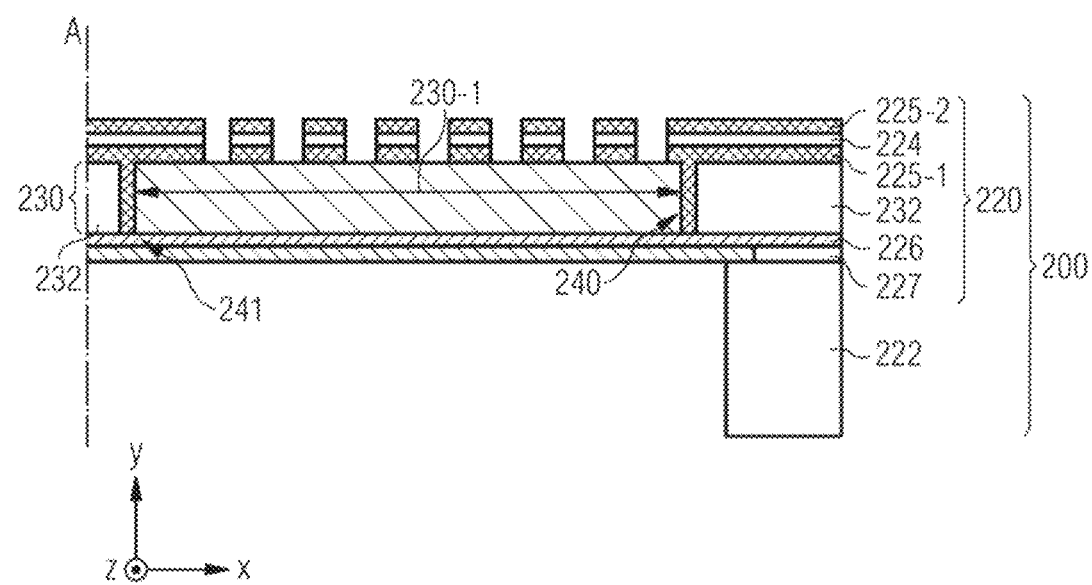

In the case of the layer arrangement 220 illustrated in FIG. 2e, there is arranged for example in a central region of the intermediate region 230 an additional circumferential etch stop structure 241 between the first and second layer structures 224, 226, such that for example the additional etch stop structure 241, which is filled for example with an oxide material, such as e.g. the material of the sacrificial layer 232, remains during the process of exposing the exposure region 230-1. Said additional etch stop structure 241 can then provide for example a mechanical connection in the central region between the first and second layer structures 224, 226. Said mechanical connection structure 241 can bring about a targeted change in the flexibility or stiffness of the membrane, in the form of the second layer structure 226. With regard to the configuration of the additional etch stop structure 241, the above-explained configurations of the etch stop structure 240 are equally applicable.

Step 140 of removing the sacrificial material 232 involves removing again the sacrificial material 232 situated in the exposure region 230-1 between the first and second layer structures 224, 226. Furthermore, the exposed sections of the intermediate layer 227 can be removed. Otherwise the above explanations in respect of FIGS. 1a-1b are once again applicable here as well.

A description will now be given hereinafter, with reference to FIG. 3, of an exemplary method 100 for producing a MEMS component 200 in a three-layer arrangement 220 in accordance with one exemplary embodiment. In order to simplify the description, the sacrificial material 232, 332, which is still present in the layer arrangement 220 in step 120 and is removed in step 140, is illustrated in a hatched manner in FIG. 3. As becomes clear from the schematic illustration of the layer arrangement 220 in FIG. 3, the layer arrangement 220 is illustrated proceeding from the edge region 230-2, 330-2 and the adjoining intermediate region 230-1, 330-1 as far as the plane A, which is arranged parallel to the y-z-plane in FIG. 3 and represents for example a plane of symmetry for the layer arrangement 220 arranged on the carrier substrate 222.

Figure 3:
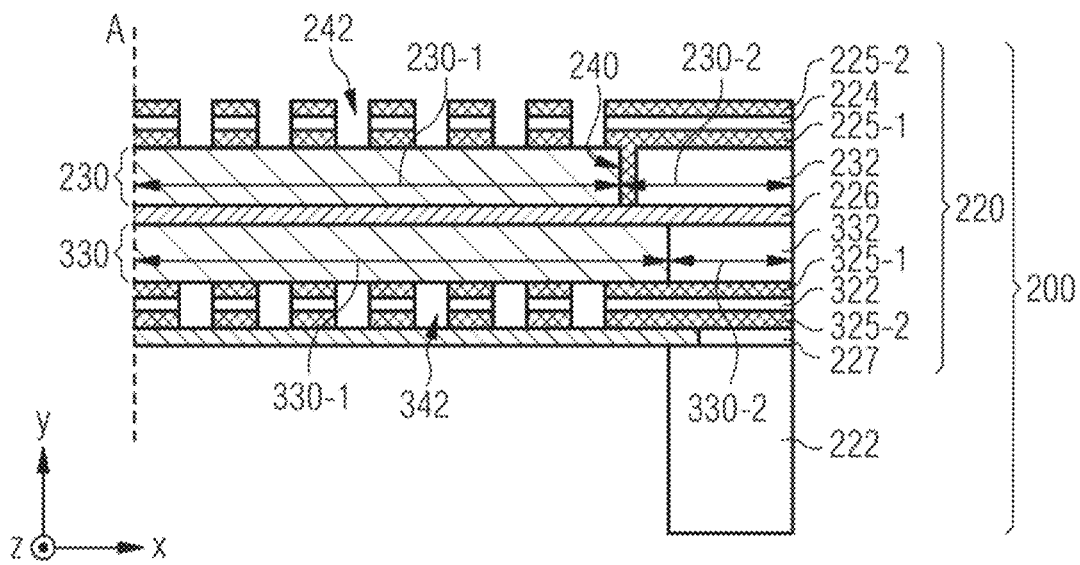
FIG. 3 shows an exemplary method for producing a MEMS component in a three-layer arrangement in accordance with one exemplary embodiment.

As is illustrated in FIG. 3, during the production method wo for a MEMS component 200, a layer arrangement 220 is provided on a carrier substrate 222, wherein the layer arrangement 220 comprises the first and second layer structures 224, 226 illustrated on the basis of the description above. The layer arrangement 220 now furthermore comprises a third layer structure 322, wherein a sacrificial material 332 is arranged between the second and third layer structures 226, 322, and wherein the third layer structure 322 has further access openings 324 to the further exposure region 330-1. As is illustrated in FIG. 3, the third layer structure 322 can furthermore be embedded into the two insulation layers 325-1, 325-2.

During the step of removing 140 the sacrificial material 232, 332, the sacrificial material 332 is then removed from the further exposure region 330-1 through the further access openings 342 by means of an etching process in order to expose the further exposure region 230-1.

As is illustrated by way of example in FIG. 3, the etch stop structure 240 is now provided only in the layer arrangement 220, while no further etch stop structure is provided in the further intermediate region 330 with the further sacrificial material 332. During step 140 of removing the sacrificial material 232, 332, now in the layer arrangement 220 the etch stop structure 240 provided there is effective as lateral delimitation of the etching process, while in the further intermediate region 330 without a further etch stop structure the etching process is defined by way of the effective etching time duration in order to form the further exposure region 330-1 between the second and third layer structures 226, 322. The further edge region 330-2 between the second and third layer structures 226, 322 is thus defined by the etching time duration.

In the case of the exemplary embodiment illustrated in FIG. 3, the first and third layer structures 224, 322 can be configured for example as an e.g. rigid counterelectrode structure, while the second layer structure 226 can be configured as a movable membrane.

Figure 4:
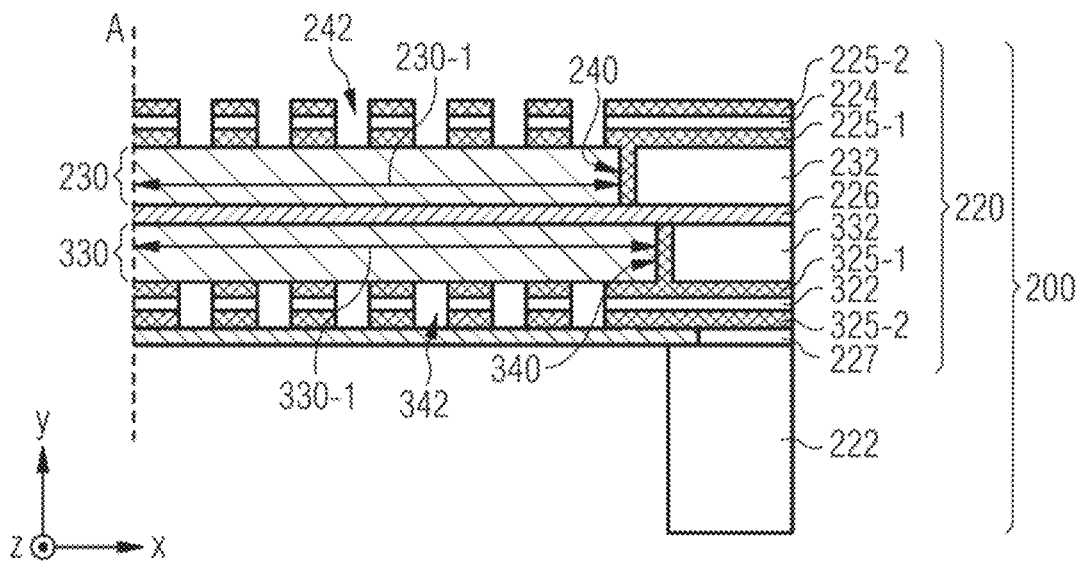
FIG. 4 shows an exemplary method for producing a MEMS component in a three-layer arrangement in accordance with a further exemplary embodiment.

In the case of the exemplary embodiment illustrated in FIG. 4, a further etch stop structure 340 is furthermore provided between the second and third layer structures 226, 322, which further etch stop structure subdivides the further intermediate region 330 into the further exposure region 330-1 and the further edge region 330-2 laterally adjoining the latter. The further etch stop structure 340 is effective as lateral delimitation for the etching process 140, wherein the sacrificial material 332 remaining in the further edge region 330-1 is effective as mechanical connection or coupling between the second and third layer structures 226, 322. As is illustrated in FIG. 4, the third layer structure 322 can furthermore be embedded into the two insulation layers 325-1, 325-2.

In order to simplify the description, the sacrificial material 232, 332, which is still present in the layer arrangement 220 in step 120 and is removed in step 140, is illustrated in a hatched manner in FIG. 4. As becomes clear from the schematic illustration of the layer arrangement 220 in FIG. 4, the layer arrangement 220 is illustrated proceeding from the edge region 230-2, 330-2 and the adjoining intermediate region 230-1, 330-1 as far as the plane A, which is arranged parallel to the y-z-plane in FIG. 4 and represents for example a plane of symmetry for the layer arrangement 220 arranged on the carrier substrate 222.

Step 140 of removing the sacrificial material 232, 332 involves removing again the sacrificial material 232, 332 situated in the exposure region 230-1, 330-1 between the first and second layer structures 224, 226 and between the second and third layer structures 226, 322, respectively. Furthermore, the exposed sections of the intermediate layer 227 can be removed.

A description will now be given hereinafter of exemplary embodiments of the production steps for the MEMS component 200 in order to obtain the layer arrangement 220 present in the step of providing 120. In accordance with one exemplary embodiment, the basic method steps presented below can be carried out for example before the step of providing 120 the layer arrangement 220.

In this regard, firstly the third layer structure 322 can be formed or applied in the form of a layer or a layer stack on the carrier substrate 222, e.g. a semiconductor substrate, or an insulation layer 227, e.g. composed of the sacrificial material, arranged on the carrier substrate 222. The step of forming the third layer structure 322 can be carried out for example by means of a depositing process. Sacrificial material 332 can subsequently be applied on the third layer structure 322. A further, circumferential through opening can thereupon be introduced into the sacrificial material 332 as far as the third layer structure 322. Finally, the further etch stop structure 340 can be introduced into the further, circumferential through opening by a further filling material structure, which is resistant to the etching process, being introduced into the further, circumferential through opening.

Afterward, the second layer structure 226 in the form of a layer or a layer stack is applied on the sacrificial material with the further etch stop structure, and if appropriate structured. The process of applying can for example be carried out once again by means of a depositing process. Afterward, further sacrificial material 232 can be applied on the second layer structure 226, whereupon a for example circumferential through opening 240 is introduced into the sacrificial material 232, e.g. in the form of a negative mold of the etch stop structure 240 to be formed, as far as the second layer structure 226. If the intention is to form an additional etch stop structure, e.g. for a mechanical connection element into a central region of the layer arrangement 220, it is correspondingly possible furthermore to form an additional, circumferential through opening in the sacrificial material 232. Afterward, the etch stop structure 240 in the circumferential through opening and optionally one or more additional etch stop structures in the one or more additional circumferential through openings are formed by introducing a filling material structure that is resistant to the etching process into the respective circumferential through opening.

Afterward, the first layer structure 224 is formed, i.e. applied and if appropriate structured, in the form of a layer or a layer stack on the sacrificial material 232 and the etch stop structure 240 or the additional etch stop structure(s). The sacrificial material 232 and the etch stop structure 240 are thus situated in the intermediate region 230 between the first and second layer structures 224, 226.

In further optional process steps (not shown in FIG. 4), in accordance with exemplary embodiments, further elements of the MEMS component, such as, for example, contact structures for the first, second and third layer structures 224, 226, 322, intermediate layers, insulation layers, insulation layers with embedded conductor tracks and/or else passivation layers can furthermore be provided.

With regard to the configuration of the further etch stop structure 340, the above explanations and elucidations concerning the configuration of the etch stop structure 240 are correspondingly equally applicable. With regard to the configuration of the further intermediate region 330, the above-explained configurations of the intermediate region 230 are equally applicable. Otherwise the above explanations in respect of FIGS. 1a-1b are once again applicable here as well.

In accordance with one exemplary embodiment, in the case of the layer arrangement 220 illustrated in FIG. 4, the first and third layer structures 224, 322 can be configured as counterelectrode structures (backplate structures), while the second layer structure 226 is configured as a movable or deflectable membrane structure. In this case this is referred to as a so-called "double-backplate structure".

In accordance with a further exemplary embodiment, in the case of the layer arrangement 220, the first and third layer structures 224, 322 can be configured as a first and second movable membrane structure, which for example can also be mechanically coupled to one another, and the second layer structure 226 can be configured as a counterelectrode structure. In this case this is referred to a double-membrane structure.

As is furthermore illustrated in FIG. 4, the first circumferential, wall-shaped etch stop structure 240 and the second circumferential, wall-shaped etch stop structure 340 are arranged in a manner offset with respect to one another at least in sections in relation to a perpendicular projection with respect to a main surface 320-*a* of the layer arrangement 320. Consequently, a first and second exposure region 230-1, 330-1 having differing lateral extents or extensions arise during step 140 of removing the sacrificial material 232, 332 from the first and second intermediate regions 230, 330.

As is illustrated in FIG. 4, by way of example, the first circumferential etch stop structure 240 has a smaller radius with respect to a common midpoint than the second circumferential etch stop structure 340. If, by way of example, the first layer structure 224 of the layer arrangement 220 of the MEMS component is then referred to as the rear side of the MEMS component 200, the mechanical robustness of the MEMS component 200 is supported from the rear side by the first etch stop structure 240 formed with a smaller radius.

In this regard, that side of a MEMS microphone which is also subjected to the higher mechanical loadings during operation can be formed with a higher mechanical robustness. In general terms this means that for example that side of the MEMS microphone which faces the sound opening of the MEMS microphone can be designed with a higher mechanical robustness.

Figure 5A:
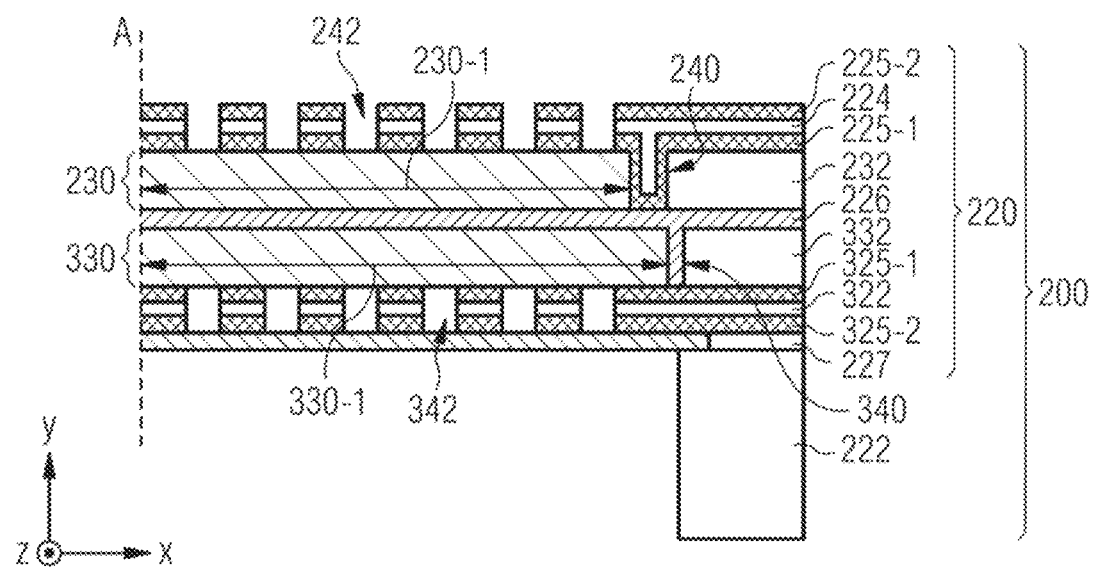
FIGS. 5a-5b show exemplary methods for producing a MEMS component with different three-layer arrangements in accordance with a further exemplary embodiment.
Figure 5B:
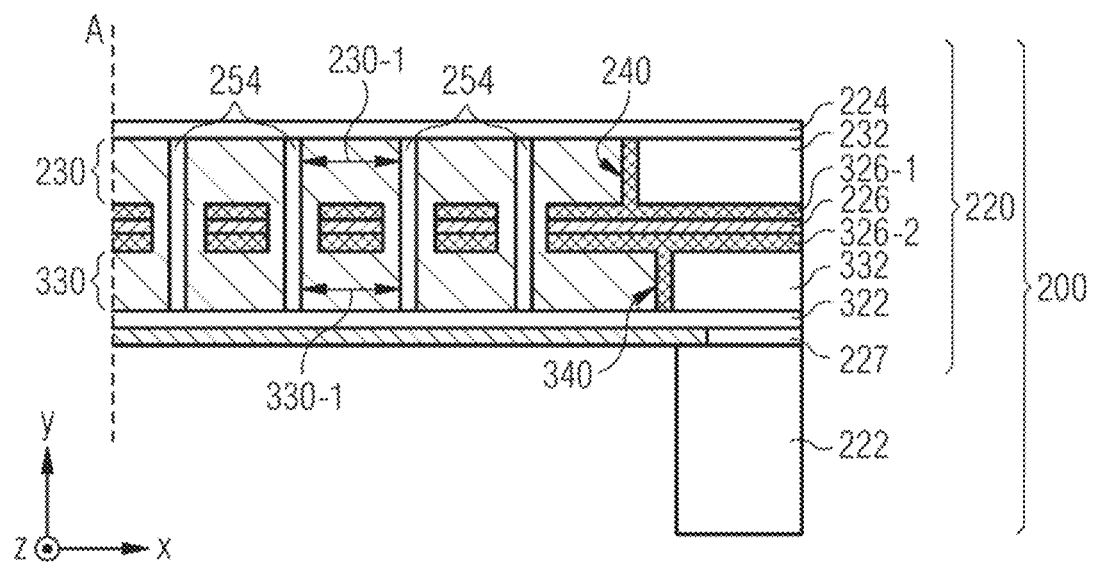

With reference to FIGS. 5*a*-5*b*, different layer arrangements 220 and different designs of the etch stop structure 240, 340 will now be described by way of example in accordance with further exemplary embodiments.

In order to simplify the description, the sacrificial material 232, 332, which is still present in the layer arrangement 220 in step 120 and is removed in step 140, is illustrated in a hatched manner in FIGS. 5*a*-5*b*. As becomes clear from the schematic illustration of the layer arrangement 220 in FIGS. 5*a*-5*b*, the layer arrangement 220 is illustrated proceeding from the edge region 230-2, 330-2 and the adjoining intermediate region 230-1, 330-1 as far as the plane A, which is arranged parallel to the y-z-plane in FIGS. 5*a*-5*b* and represents for example a plane of symmetry for the layer arrangement 220 arranged on the carrier substrate 222.

As is illustrated in FIG. 5*a*, the etch stop structure 240 comprises an outer etchant-resistant layer e.g. component of the material of the insulation layer 225-1, e.g. composed of a nitride material, and also an inner layer composed of the material of the first layer structure 224, such as e.g. a polycrystalline or monocrystalline silicon material. As is furthermore illustrated in FIG. 5*a*, the further etch stop structure 340 comprises a layer composed of the material of the second layer structure 226, such as e.g. a polycrystalline or monocrystalline silicon material. Step 140 of removing the sacrificial material 232, 332 involves removing again the sacrificial material 232, 332 situated in the exposure region 230-1, 330-1 between the first and second layer structures 224, 226 and between the second and third layer structures 226, 322, respectively. Furthermore, the exposed sections of the intermediate layer 227 can be removed.

As is furthermore illustrated in FIG. 5*a*, the first circumferential etch stop structure 240 and the second circumferential etch stop structure 340 can be arranged in a manner offset with respect to one another at least in sections in relation to a perpendicular projection with respect to a main surface region 320-*a* of the layer arrangement 320. Consequently, a first and second exposure region 230-1, 330-1 having differing lateral extents or extensions arise during step 140 of removing the sacrificial material 232, 332 from the first and second intermediate regions 230, 330.

As is illustrated in FIG. 5*a*, by way of example, the first circumferential etch stop structure 240 has a smaller radius with respect to a common midpoint than the second circumferential etch stop structure 340. If, by way of example, the first layer structure 224 of the layer arrangement 220 of the MEMS component is then referred to as the rear side of the MEMS component 200, the mechanical robustness of the MEMS component 200 is supported from the rear side by the first etch stop structure 240 formed with a smaller radius. In this regard, that side of a MEMS microphone which is also subjected to the higher mechanical loadings during operation can be formed with a higher mechanical robustness.

In the case of the exemplary embodiment in FIG. 5*a*, by way of example, the first and third, conductive layer structures 224, 322 can be configured as a counterelectrode structure, wherein the second, conductive layer structure 226 can be configured as a membrane structure. In this case this is referred to as a double-backplate structure.

In the case of the exemplary embodiment illustrated in FIG. 5*b*, the first and second circumferential, wall-shaped etch stop structures 240, 340 are formed from an etchant-resistant insulation material, e.g. a nitride material, wherein provision is furthermore made of mechanical connection elements 254 between the first and third layer structures 224, 322, which yield a mechanical coupling of the first and third layer structures 224, 322, and are mechanically decoupled from the second layer structure 226. Consequently, the first and third layer structures 224, 322 are configured for example as a movable membrane structure, which are mechanically coupled to one another via the connection elements 254 and are deflectable relative to the second layer structure 226 configured as a rigid counterelectrode. In this case this is referred to as a double-membrane structure with a single counterelectrode structure. The mechanical connection elements are once again formed from a material that is resistant to the etching process, e.g. a nitride material.

As is illustrated in FIG. 5*b*, by way of example, the first circumferential etch stop structure 240 has a smaller radius with respect to a common midpoint than the second circumferential etch stop structure 340. As is furthermore illustrated in FIG. 5*b*, the second layer structure 226 can furthermore be embedded into the two insulation layers 326-1, 326-2.

Figure 6A:
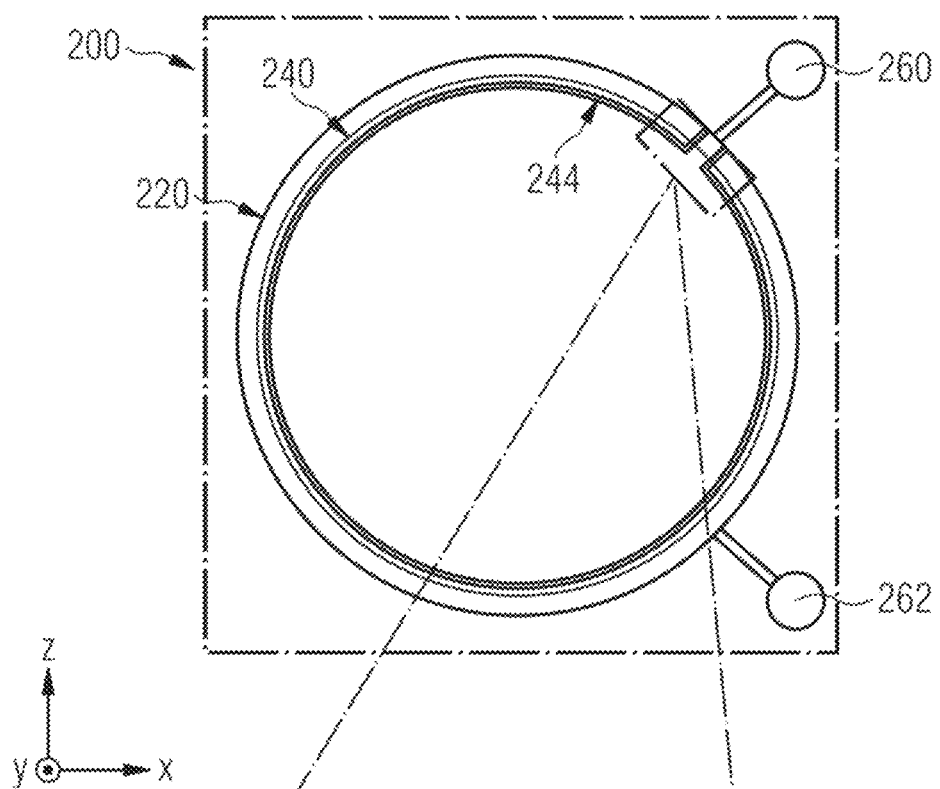
FIGS. 6a-6c show an exemplary MEMS component having a circumferential wall-shaped etch stop structure in accordance with one exemplary embodiment.
Figure 6B:
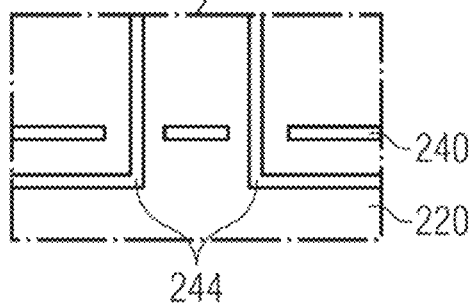
Figure 6C:
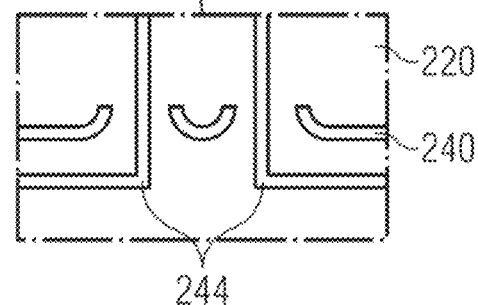

FIGS. 6*a*-6*c* then show, in a plan view, one exemplary embodiment of a layer arrangement 220, wherein the first and second layer structures 224, 226 are arranged in circular fashion and furthermore the circumferential etch stop structure 240 is correspondingly arranged in circular fashion. Furthermore, the layer arrangement has a segmentation 244 e.g. in the first layer structure 224, which segmentation is configured in turn in circular fashion in a manner extending circumferentially and closed apart from the contacting region. The contacting elements or electrode structures 260, 262 are provided for electrically contacting the first layer structure and the second layer structure 226.

FIG. 6b then illustrates an enlarged illustration of the region identified in FIG. 6a in which the segmentation 244 is led outward in order to connect the layer structure having the segmentation to the electrode structure 260. As is illustrated in the enlarged illustration in FIG. 6b, it is possible for technological reasons, for example, for the circumferential, wall-shaped etch stop structure 240 to be interrupted for example at the otherwise present crossover points with the segmentation 244.

Said interruption(s) of the circumferential, wall-shaped etch stop structure 240 can be provided in order that damage or impairment of the already present segmentation 244 of the layer arrangement 220 is avoided during the production or the etching of the trench for the wall-shaped etch stop structure 240. Without interruption(s), partial etching or incipient etching of the segmentation 244 could otherwise take place during the process of etching the trench for the circumferential, wall-shaped etch stop structure 240 at the otherwise present crossover or contact points with the segmentation 244, i.e. if the segmentation 244 is effective as a stop layer for the etching process at such a crossover point. By providing interruptions at the otherwise present crossover points between the wall-shaped etch stop structure 240 and the segmentation 244, it is possible to prevent damage of the segmentation 244 during the etching process and thus to prevent possible resulting electrical leaks or dissipations or else a reduction of the mechanical stability.

As is then illustrated in the enlarged illustration in FIG. 6c of the identified region from FIG. 6a, the ends or end sections of the wall-shaped etch stop structure 240 that are arranged there can additionally be configured such that they are curved outward.

This outward curvature of the end sections of the wall-shaped etch stop structure 240 at the interruption locations at the otherwise present crossover points with the segmentation 244 prevents or at least reduces a mechanical stress concentration at the edges or end sections of the wall-shaped etch stop structure 240. The curved end sections of the wall-shaped etch stop structure 240 can thus bring about a stress relief in these regions of the etch stop structure 240.

Figure 7A:
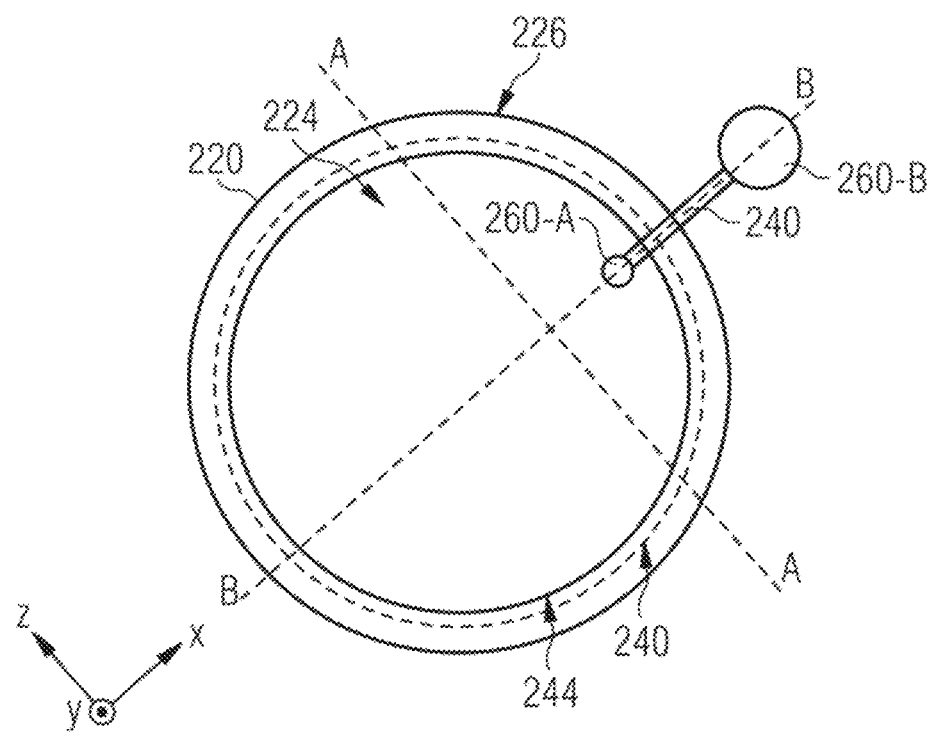
FIGS. 7a-7b show an exemplary MEMS component having a wall-shaped etch stop structure extending circumferentially in a closed fashion in accordance with a further exemplary embodiment.
Figure 7B:
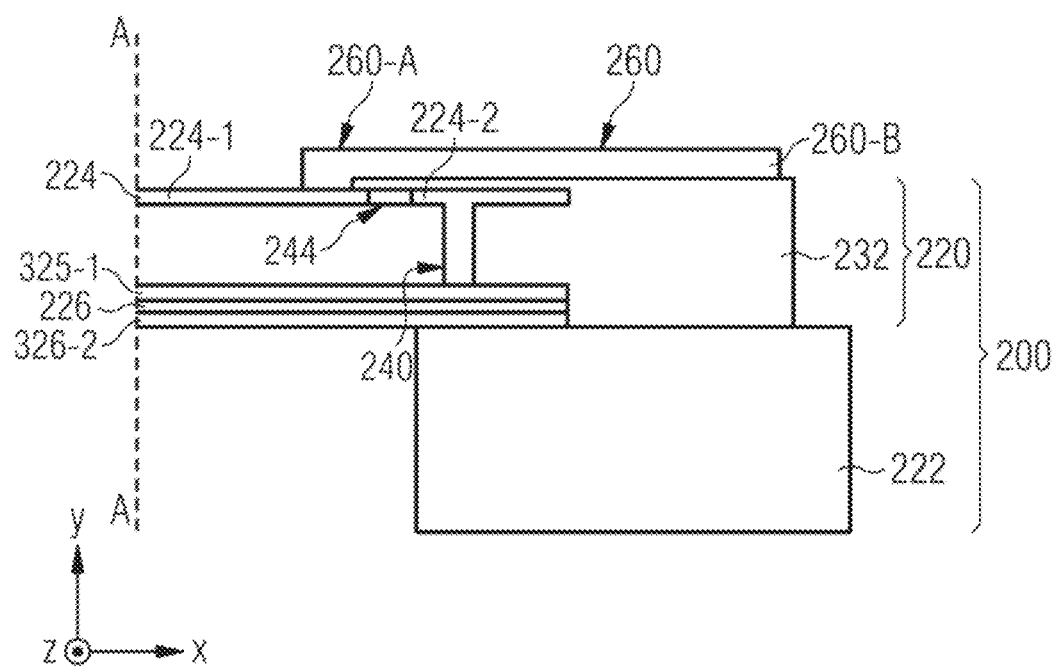

FIGS. 7a-b show a further exemplary embodiment of a layer arrangement 220 with a further design of the etch stop structure 240.

As is illustrated in the plan view in FIG. 7a, the first layer structure 224 has a circumferential, completely closed segmentation 244, wherein the completely closed circumferential wall-shaped etch stop structure 240 is formed for example from the material of the first layer structure 224 or alternatively can be formed from some other etchant-resistant material. The second layer structure 226 is embedded in insulation layers 225-1, 225-2, for example, and thus electrically isolated from the second section 224-2 of the first layer structure 224.

In accordance with a further exemplary embodiment, the second layer structure 226 surrounded by the insulation layers 225-1, 225-2 can also be electrically connected to the second section 224-2 of the first layer structure 224, wherein the second layer structure 226 and the second section 224-2 of the first layer structure 224 can once again be electrically isolated from the first section 224-1 of the first layer structure 224 by means of the segmentation 244. This can contribute to a reduction of parasitic capacitances at the edge region of the first and second layer structures 224, 226.

As is then furthermore illustrated in FIGS. 7a-b, the electrode structure 260 for the first, active region 224-1 of the first layer structure is led from above to this first region 224-1 and electrically isolated from the second section 224-2 of the first layer structure 224 by an insulation material, e.g. an oxide material (sacrificial material).

In FIGS. 7a-7b, furthermore, the plane A of symmetry is illustrated parallel to the y z plane, while the sectional plane B through the layer arrangement 220 is illustrated parallel to the x-y plane.

The contacting structure or electrode structure 260 is provided for electrically contacting the first section 224-1 of the first layer structure 224, e.g. the deflectable, active section 224-1 of the first layer structure 224 configured for example as a membrane. This separate configuration of the electrical contacting of the first region 224-1 of the first layer structure 224 makes it possible to avoid an interruption both of the circumferential wall-shaped etch stop structure 240 and of the segmentation 244, that is to say that both the etch stop structure 240 and the segmentation 244 can each be configured completely circumferentially and also in a completely closed manner, i.e. in a manner free of interruption.

This externally provided electrode structure 260 of the first section 224-1 of the first layer structure 224 makes it possible to maintain the axial symmetry of the first layer structure 224 configured as a circular membrane, for example, by virtue of the fact that the electrode structure 260 is led at the inner contacting region 260-A from the inner section 224-1 of the first layer structure 224 across the segmentation 244 and the etch stop structure 240, i.e. in a manner spatially separated from same, outward to the outer contacting region 260-B of the electrode structure 260. In contrast to the illustration in FIG. 6a, wherein the segmentation is configured to provide an electrical connection of the first section 224-1 of the first layer structure 224 at the outer or edge region of the layer structure 224 to the electrode structure 260, in the case of the exemplary embodiment illustrated in FIGS. 7a-7b the electrode structure 260 is electrically contacted directly with the first section 224-1 of the first layer structure 224 in order to be able to prevent an interruption of the circumferential segmentation 244 of the first layer structure 224 and thus also of the etch stop structure 240 configured in a wall-shaped fashion. As a result, it is possible to achieve a further increase in the mechanical stability or robustness of the first layer structure 224 configured for example as a movable membrane. Furthermore, a further reduction of parasitic effects can be brought about as a result of the completely axially symmetrical configuration of the for example disk-shaped membrane 224.

Figure 8A:
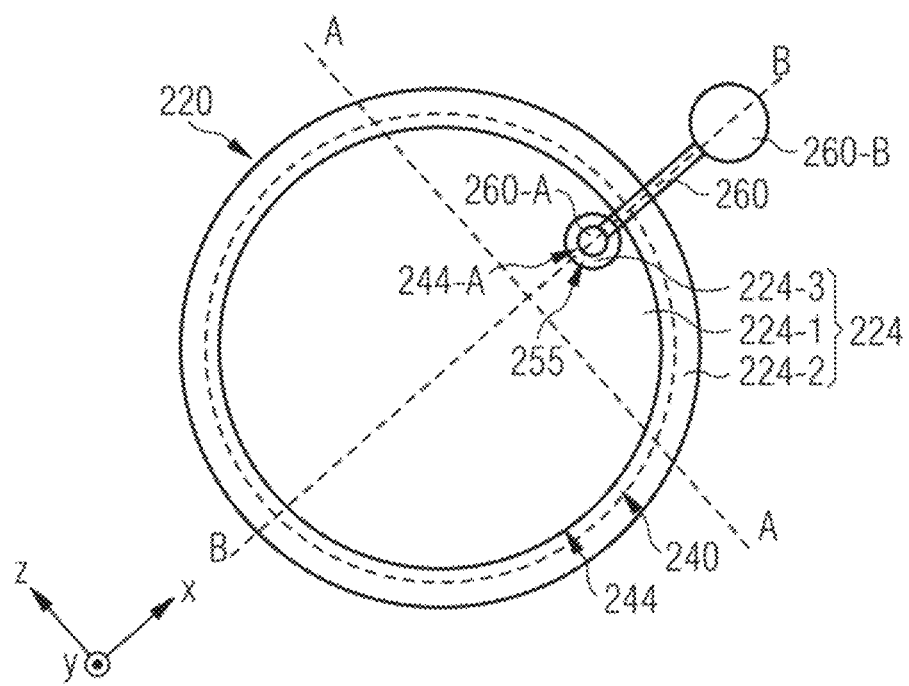
FIGS. 8a-8b show an exemplary MEMS component having a circumferential, wall-shaped etch stop structure in accordance with a further exemplary embodiment.
Figure 8B:
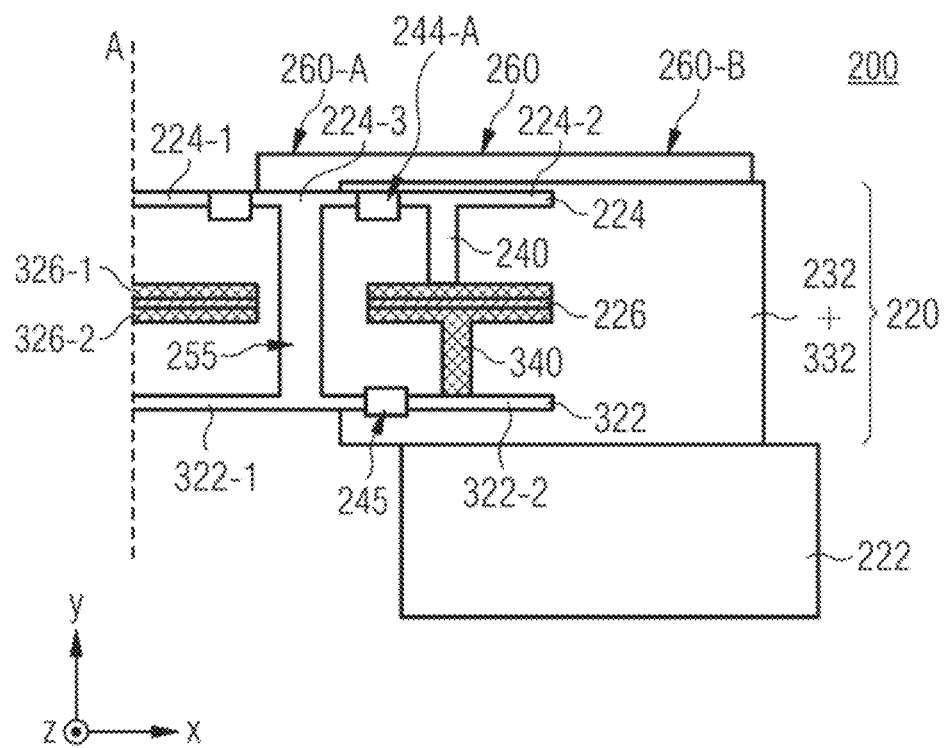

FIGS. 8a-8b then show a further exemplary embodiment of a layer arrangement 220 of a MEMS component 200 having a so-called double-membrane structure 224, 322 and a single counterelectrode structure 226 and having a further configuration of the etch stop structure 240, 340 in accordance with a further exemplary embodiment.

As is illustrated in the plan view in FIG. 8a and also the partial sectional view in FIG. 8b, the first and second circumferential, wall-shaped etch stop structures 240 and 340 are each formed from an etchant-resistant material. In this regard, the wall-shaped etch stop structure 240 can be formed for example from the material of the first layer structure 224, e.g. a semiconductor material, while the second etch stop structure 340 can be formed from the material of the two insulation layers 326-1, 326-2 surrounding the second layer structure 226, i.e. for example from a nitride material. However, the first and second etch stop structures 240, 340 can also be formed from some other etchant-resistant material. Furthermore, the first layer structure 224, configured for example as a movable membrane, has a segmentation 244, wherein the segmentation 244 of the first layer structure 224, said segmentation being formed with an insulation material, yields an electrical insulation or isolation between a first inner section 224-1 and a second, outer section 224 2 of the conductive first layer structure 224. The segmentation 244 of the first layer structure 224 can be arranged for example in order to provide an electrical isolation between the active or deflectable section 224-1 and the substantially inactive non-deflectable section 224-2 of the first layer structure 224 configured as a membrane.

The layer arrangement 220 then furthermore comprises a third layer structure 322, which in turn has a segmentation 245. The segmentation 245 of the third layer structure 322, said segmentation being formed with an insulation material yields an electrical insulation or isolation between a first inner section 322-1 and a second, outer section 322-2 of the conductive third layer structure 322. The segmentation 245 of the conductive third layer structure 322 configured for example as a membrane can be arranged for example in order to provide an electrical isolation between the active or deflectable section 322-1 and the substantially inactive, non-deflectable section 322-2 of the third layer structure 322 configured as a membrane.

The segmentations 244, 245 can for example each be realized as a circumferential narrow trench or a circumferential narrow cutout filled with an insulating material in order to obtain on the one hand an electrical isolation of the adjacent sections, but a mechanical connection of same.

Furthermore, in an edge region of the first, inner section 224-1 of the first layer structure 224, a further circumferential or closed segmentation 244-A is provided in order to define a further region 224-3 within the first section 224-1 of the first layer structure 224 as a third section or island section 224-3 electrically insulated therefrom. The third section 224-3 with the surrounding segmentation 245 is arranged adjacent to the segmentation 244 in the first section 224-1 of the first layer structure 224. The area of the island section 224-3 is less than 10%, 5% or 1% of the area of the first section 224-1 of the first layer structure.

Furthermore, provision is made of a mechanical and electrical connection element 255 between the third section 224-3 (island section) and the first section 322-1 of the third layer structure 322, which yields an electrical coupling of the third section 224-3 of the first layer structure 224 and of the first section 322-1 of the third layer structure.

The conductive connection element 255 can be configured for example as a conductive column or as an electrical feedthrough (VIA) from the island region 224-3 of the first layer structure 224 to the first, active section 322-1 of the third layer structure 322. The segmentation 244-A is provided within the segmentation 244 or within the first section 224-1 of the first layer structure 224 in order to provide a contacting region for an electrical contacting region 260-A of the electrode structure 260.

The first and third layer structures 224, 322 can be configured as movable membrane structures, for example, which are mechanically coupled to one another by means of further, optional connection elements (not shown in FIGS. 8a-8b, cf. connection elements 254 from FIG. 5b) and are deflectable relative to the second layer structure 226 configured as a relatively rigid counterelectrode. In this case this is referred to as a double-membrane structure with a single counterelectrode structure. The second layer structure 226 can furthermore be surrounded by the two insulation layers 326-1, 326-2 or be embedded in same.

As is then furthermore illustrated in FIGS. 8a-8b, the electrode structure 260 with the contact region 260-A for the third section 224-3 (island region) of the first layer structure 224 is led from above to said third region 224-3 and electrically isolated from the second section 224-2 of the first layer structure 224 by an insulation material, e.g. an oxide material.

In FIGS. 8a-8b, furthermore, the plane A is illustrated parallel to the x z plane, while the sectional plane B through the layer arrangement 220 is illustrated parallel to the x y plane. It becomes clear from FIGS. 8a-8b that the partial sectional illustration in FIG. 8b illustrates only part of the extension of the layer arrangement 220 parallel to or along the x-axis. The explanations regarding the electrode structure 260 from FIGS. 7a-7b, are correspondingly applicable to the electrode structure 260 in FIGS. 8a-8b.

Figure 9:
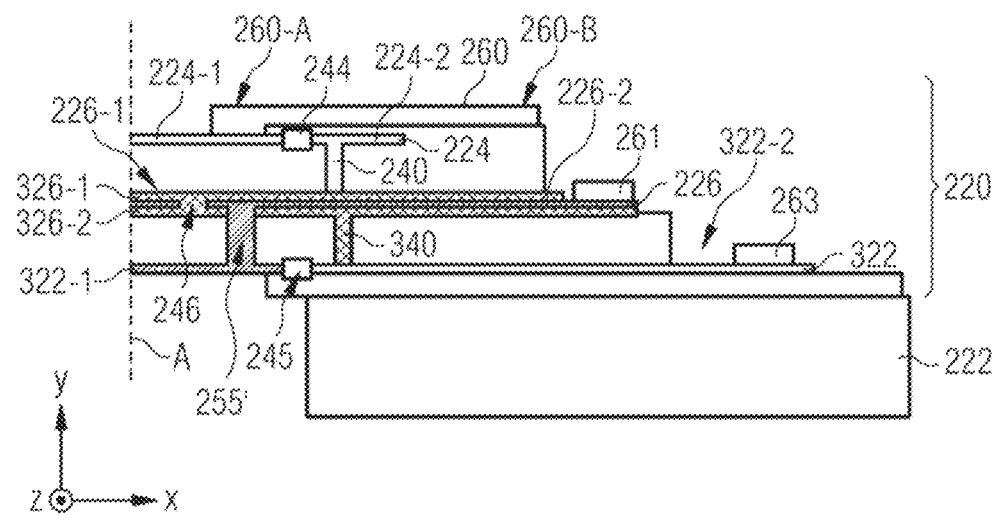
FIG. 9 shows an exemplary method for producing a MEMS component in a three-layer arrangement in accordance with a further exemplary embodiment.

FIG. 9 then shows a further exemplary embodiment in the form of a partial cross-sectional arrangement of a layer arrangement 220 of a MEMS component 200 having a so-called "double-membrane structure" 224, 322 and a single counterelectrode structure 226 and having the etch stop structures 240, 340 in accordance with a further exemplary embodiment.

In FIG. 9, once again the plane A is illustrated parallel to the x z plane, while the sectional plane B through the layer arrangement 220 is illustrated parallel to the x y plane. It becomes clear from FIG. 9 that the partial sectional illustration illustrates only part of the extension of the layer arrangement 220 parallel to or along the x-axis.

As is illustrated in the partial sectional view in FIG. 9, the first and second circumferential, wall-shaped etch stop structures 240, 340 are each formed from an etchant-resistant material. In this regard, the wall-shaped etch stop structure 240 can be formed for example from the material of the first layer structure 224, e.g. a semiconductor material (e.g. polysilicon), while the second etch stop structure 340 can be formed from the material of the two insulation layers 326-1, 326-2 surrounding the second layer structure 226, i.e. for example from a nitride material. However, the first and second etch stop structures 240, 340 can also be formed from some other etchant-resistant material. Furthermore, the first layer structure 224, configured for example as a movable membrane, has a segmentation 244, wherein the segmentation 244 of the first layer structure 224, said segmentation being formed with an insulation material, yields an electrical insulation or isolation between a first inner section 224-1 and a second, outer section 224 2 of the conductive first layer structure 224. The segmentation 244 of the first layer structure 224 can be arranged for example in order to provide an electrical isolation between the active or deflectable section 224-1 and the substantially inactive non-deflectable section 224-2 of the first layer structure 224 configured as a membrane. The second layer structure 226, which is configured for example as a counterelectrode or as a center stator of the double-membrane structure, furthermore has a segmentation 246, wherein the segmentation 246 of the second layer structure 226, said segmentation being formed with an insulation material, yields an electrical insulation or isolation between a first inner section 226-1 and a second, outer section 226-2 of the second layer structure 226.

The layer arrangement 220 then furthermore comprises a third layer structure 322, which in turn has a segmentation 245. The segmentation 245 of the third layer structure 322, said segmentation being formed with an insulation material, yields an electrical insulation or isolation between a first inner section 322-1 and a second, outer section 322-2 of the conductive third layer structure 322.

The segmentations 244, 245, 246 can for example each be realized again as a circumferential narrow trench or a circumferential narrow cutout filled with an insulating material in order to obtain on the one hand an electrical isolation of the adjacent sections, but also a mechanical connection of same.

Furthermore, provision is made of a mechanical and electrical connection element 255' between the second section 226-2 of the second layer structure 226 and the first section 322-1 of the third layer structure 322 in order to obtain an electrical coupling of the second section 226-2 of the second layer structure 226 and of the first section 322-1 of the third layer structure. The conductive connection element 255' can be configured for example as a conductive column or as an electrical feedthrough (via) from the outer, second section 226-2 of the second layer structure to the first, active section 322-1 of the third layer structure 322.

The first and third layer structures 224, 322 can be configured as movable membrane structures, for example, which are mechanically coupled to one another by means of further, optional connection elements (not shown in FIG. 9, cf. connection elements 254 from FIG. 5b) and are deflectable relative to the second layer structure 226 configured as a relatively rigid counterelectrode. In this case this is referred to as a double-membrane structure 224, 322 with a single counterelectrode structure 226. The second layer structure 226 can furthermore be surrounded by the two insulation layers 326-1, 326-2 or be embedded in same, apart from the connection region with the connection element 255'.

As is then furthermore illustrated in FIG. 9, the electrode structure 260 with the contact region 260-A for the first section 224-1 of the first layer structure 224 is led from above to said first region 224-1 and electrically isolated from the second section 224-2 of the first layer structure 224 by an insulation material, e.g. an oxide material. Furthermore, FIG. 9 illustrates further electrode or contacting structures 261, 263, wherein the electrode structure 261 is connected to the second section 226-2 of the second electrode structure 226, and the electrode structure 263 is electrically connected to the second section 322-2 of the third electrode structure 322.

FIG. 9 thus shows an exemplary embodiment of a layer arrangement 220 of the MEMS component 200 in which the first section 224-1 of the first electrode structure is contacted directly, while the first section 322-1 of the third electrode structure is contacted via the conductive, columnar connection element 255 to the second, outer section 226-2 of the second layer structure 226 and there to the further electrode structure 261.

The configuration illustrated in FIGS. 7a-7b, 8a-8b and 9 for the electrical contacting of the first region 224-1 of the first layer structure 224 and, in FIGS. 8a-8b and 9, furthermore of the first region 322-1 of the third layer structure 322 makes it possible to avoid an otherwise required interruption both of the circumferential wall-shaped etch stop structures 240, 340 and of the segmentations 244, 245 and 246, respectively, that is to say that the etch stop structures 240, 340 and also the segmentations can each be configured completely circumferentially and also in a completely closed manner, i.e. in a manner free of interruption.

The externally provided electrode structures thus make it possible to maintain the axial symmetry of the layer structures 224, 226 and 322 configured in circular fashion, for example.

One exemplary embodiment of a MEMS component 200 will now be described hereinafter with reference to FIG. 10.

The MEMS component 200 comprises for example a layer arrangement 220 on a carrier substrate 222, wherein the layer arrangement 220 comprises a first and second layer structure 224, 226, wherein an exposure region is exposed between the first and second layer structures 224, 226, wherein a sacrificial material is arranged in an edge region 230-2 between the first and second layer structures 224, 226, wherein an etchant-resistant wall structure 240, 241, 340 extending between the first and second layer structures 224, 226 demarcates the exposure region 230-1 from the edge region 230-2 laterally adjoining the latter, and wherein the insulation material present in the edge region is effective for mechanical connection between the first and second layer structures 224, 226.

In accordance with one exemplary embodiment, the etchant-resistant wall structure 240, 241, 340 is arranged as a circumferential edge region around the exposure region 230-1.

In accordance with one exemplary embodiment, the layer arrangement 220 comprises in the exposure region 230-1 an additional etchant-resistant wall structure 241 arranged between the first and second layer structures 224, 226.

In accordance with one exemplary embodiment, the first layer structure 224 is configured as a rigid counterelectrode structure, wherein the second layer structure 226 is configured as a deflectable membrane structure.

In accordance with one exemplary embodiment, the layer arrangement 220 comprises a third layer structure 322, wherein a further exposure region is exposed between the second and third layer structures 226, 322, wherein an insulation material is arranged in a further edge region 330-2 between the second and third layer structures 226, 322, wherein an etchant-resistant wall structure 340 extending between the second and third layer structures 226, 322 demarcates the further exposure region from the further edge region 330-2 laterally adjoining the latter, wherein the insulation material present in the further edge region 330-2 is effective for mechanical connection between the second and third layer structures 226, 322.

In accordance with one exemplary embodiment, the further etchant-resistant wall structure 340 is arranged as a further, circumferential edge region around the further exposure region 330-1 between the second and third layer structures 226, 322.

In accordance with one exemplary embodiment, the further etchant-resistant wall structure 340 comprises a further layer sequence composed of a plurality of filling material layers.

In accordance with one exemplary embodiment, the etchant-resistant circumferential wall structure 240 adjoining the exposure region 230-1 and the further, circumferential etchant-resistant wall structure 241 adjoining the further edge region 330-2 are arranged in a manner laterally offset with respect to one another.

In accordance with one exemplary embodiment, the first and third layer structures 224, 322 are configured as counterelectrode structures, wherein the second layer structure 226 is configured as a deflectable membrane structure between the counterelectrode structures.

In accordance with one exemplary embodiment, the first and third layer structures 224, 322 are configured as a first and second membrane structure, wherein the second layer structure 226 is configured as a counterelectrode structure arranged between the first and second membrane structures.

Figure 10:
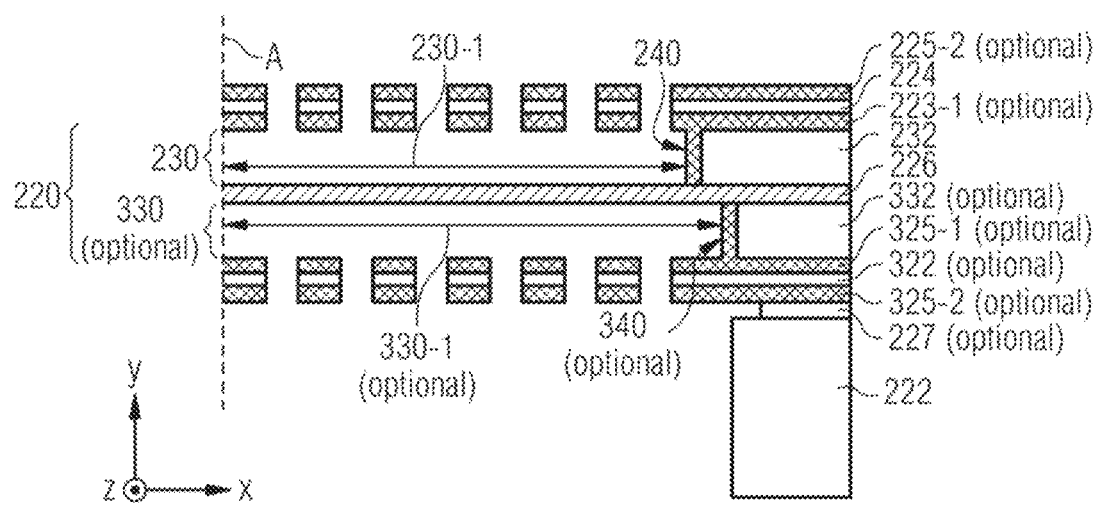
FIG. 10 shows an exemplary MEMS component having a wall-shaped etch stop structure in accordance with a further exemplary embodiment.

The MEMS component 300 can be produced in accordance with the method 100 described above, wherein the explanations there in FIGS. 1*a* to 9 are equally applicable to the exemplary embodiment of the MEMS component as illustrated in FIG. 10.

Some of the exemplary embodiments of the present method for producing a MEMS component 200 and of the layer arrangement 220 provided therefor will be described again hereinafter.

In this regard, the etch stop structure 240, 241, 340 configured in wall-shaped fashion can be formed from the same material of the assigned layer structure, i.e. from the material of the first, second or third layer structure, or else from a further material that is resistant to the etching process.

The sacrificial layer material can for example comprise silicon oxide and be etched using hydrofluoric acid (HF). In this case, the outer or exterior sections of the wall-shaped etch stop structure 240, 241, 340 which come into contact with the etchant used during the etching process can comprise for example a polysilicon material or a silicon nitride material.

The wall-shaped etch stop structure 240, 241, 340 can for example comprise an insulating material and be configured in an insulating fashion between the respectively adjoining layer structures 224, 226, 322 in order to avoid a short circuit between the adjacent layer structures, i.e. for example between the membrane structure and the counterelectrode structure.

If a segmentation is provided in one of the layer structures 224, 226, 322 and the wall-shaped etch stop structure 240, 241, 340 comprises a conductive material, and the conductive material is electrically connected for example to one of the layer structures 224, 226, 322, the circumferential etch stop structure 240, 241, 340 can be arranged for example within the segmented region.

If the wall-shaped etch stop structure 240, 241, 340 is formed from a dielectric material, the etch stop structure 240, 241, 340 can be arranged within the segmented region or outside the segmented region from the electrical standpoint.

In accordance with exemplary embodiments, the wall-shaped etch stop structure 240, 241, 340 can be configured continuously or substantially continuously with small discontinuities or interruptions. In the case where interruptions are provided in the circumferential etch stop structure 240, 241, 340, the individual end regions or edge regions of the etch stop structure 240, 241, 340 can be configured in curved fashion, e.g. can be configured in a manner curved outward.

The etch stop structure 240, 241, 340 can have for example the same basic shape or contour or a contour almost the same as the cavity 223 in the substrate 222, wherein the contour is configured in circular fashion, for example, but can also have different shapes, such as square, rectangular, with rounded angles.

Furthermore, the additional etch stop structure 241 can be provided in the same interspace or intermediate region for defining the exposure region, i.e. within the circumferential etch stop structure 240, in order to form for example one or more anchoring points in the form of mechanical connection elements between the first and second layer structures 224, 226, i.e. between the membrane structure and the counterelectrode structure.

If the MEMS component is configured for example as a double-counterelectrode micro-phone (double-backplate microphone), the first or second exposure region or air gap can be configured with different radii in order to introduce a desired asymmetry of the mechanical robustness between the front and rear sides of the microphone. In this regard, the layer structure adjoining the air gap having the smaller radius has a generally higher mechanical robustness vis-à-vis mechanical loadings.

Furthermore, in the case of a configuration having two outer layer structures 224, 322 and a further layer structure 226 arranged therebetween, a wall-shaped etch stop structure can be provided between two adjacent layer structures in order to define the exposure edge region, while the further exposure edge region is defined between the further two layer structures for example by means of the etching time duration.

In the case of a layer arrangement having two layer structures, one layer structure can form a membrane structure and the further layer structure can form a counterelectrode structure. In the case of a layer arrangement having three layer structures, a membrane structure can be arranged in an intervening fashion between two counterelectrode structures, wherein two membrane structures with an intervening counterelectrode structure can be provided in accordance with a further configuration. These two membrane structures can furthermore be mechanically connected to one another.

Additional exemplary embodiments and aspects of the invention are described, which can be used individually or in combination with the features and functionalities described herein.

In accordance with a first aspect, a production method 100 for a MEMS component 200 can comprise the following steps: providing a layer arrangement 220 on a carrier substrate 222, wherein the layer arrangement 220 comprises a first and second layer structure 224, 226, wherein a sacrificial material 232 is arranged in an intermediate region 230 between the first and second layer structures 224, 226, wherein an etch stop structure 240 extending between the first and second layer structures 224, 226 subdivides the intermediate region 230 into an exposure region 230-1 and an edge region 230-2 laterally adjoining the latter, and wherein at least one of the layer structures 224, 226 has access openings 242 to the exposure region 230-1, and removing the sacrificial material 232 from the exposure region 230-1 through the access openings 242 by means of an etching process in order to expose the exposure region 230-1, wherein the etch stop structure 240 is effective as lateral delimitation for the etching process, and wherein the sacrificial material 232 present in the edge region 230-2 is effective for mechanical connection between the first and second layer structures 224, 226.

In accordance with a second aspect referring to the first aspect, in the production method 100, the etch stop structure 240 can be arranged as a circumferential edge region around the exposure region 230-1 in the layer arrangement 220.

In accordance with a third aspect referring to the first aspect, in the production method 100, the layer arrangement 220 can comprise in the intermediate region 230 an additional, closed etch stop structure 241 extending between the first and second layer structures 224, 226.

In accordance with a fourth aspect referring to the first aspect, in the production method 100, before step 120 of providing the layer arrangement 220 the following steps for forming the layer arrangement 220 can be carried out: forming the second layer structure 226 on the carrier substrate 222, applying sacrificial material 232 on the second layer structure 226, introducing a circumferential through opening into the sacrificial material 232 as far as the second layer structure 226, forming the etch stop structure 240 in the circumferential through opening by introducing a filling material structure that is resistant to the etching process into the circumferential through opening, and forming the first layer structure on the sacrificial material 232 and the etch stop structure 240.

In accordance with a fifth aspect referring to the fourth aspect, the production method 100 can furthermore comprise the following step: forming the etch stop structure 240 by introducing a layer sequence composed of a plurality of filling materials into the circumferential through opening.

In accordance with a sixth aspect referring to the fourth aspect, the production method 100 can furthermore comprise the following steps: introducing an additional through opening into the sacrificial material 232 as far as the second layer structure 226; and forming an additional etch stop structure 240-1 in the additional through opening by introducing an additional filling material structure that is resistant to the etching process into the additional through opening.

In accordance with a seventh aspect referring to the first aspect, in the production method 100, step 140 of removing the sacrificial material 232 can be carried out by means of an anisotropic etching process using an etchant, wherein the etchant has an etching rate which is higher for the sacrificial material 232 than for the material of the etch stop structure 240 at least by a factor of 10.

In accordance with an eighth aspect referring to the first aspect, in the method, the first layer structure 224 can be configured as a counterelectrode structure, and the second layer structure 226 can be configured as a deflectable membrane structure.

In accordance with a ninth aspect referring to the first aspect, in the production method 100, the first layer structure 224 can be configured as a deflectable membrane structure, and the second layer structure 226 can be configured as a counterelectrode structure.

In accordance with a tenth aspect referring to the first aspect, in the production method 100, the layer arrangement 220 can comprise a third layer structure 322, wherein a further sacrificial material 332 is arranged in a further intermediate region 330 between the second and third layer structures 226, 322, and wherein the third layer structure 322 has further access openings 342 to the further exposure region 330-1, and wherein the further sacrificial material 332 is removed from the further exposure region 330-1 through the further access openings 342 by means of the etching process in order to expose the further exposure region 330-1.

In accordance with an eleventh aspect referring to the tenth aspect, in the production method 100, a further etch stop structure 340 can be arranged between the second and third layer structures 226, 322, which further etch stop structure subdivides the further intermediate region 330 into a further exposure region 330-1 and a further edge region 330-2 laterally adjoining the latter, wherein the further etch stop structure 340 is effective as lateral delimitation for the etching process, and wherein the sacrificial material 332 remaining in the further edge region 320-2 is effective for mechanical connection between the second and third layer structures 226, 322.

In accordance with a twelfth aspect referring to the first aspect, in the production method 100, before step 120 of providing the layer arrangement 220 the following steps for forming the layer arrangement 220 can be carried out: forming the third layer structure on the carrier substrate 222, applying sacrificial material 332 on the third layer structure 322, introducing a circumferential through opening into the sacrificial material as far as the third layer structure 322, forming the further etch stop structure 340 in the further circumferential through opening by introducing a further filling material structure that is resistant to the etching process into the further circumferential through opening, forming the second layer structure on the sacrificial material 332 and the further etch stop structure 241, applying sacrificial material 232 on the second layer structure 226, introducing a circumferential through opening into the sacrificial material 232 as far as the second layer structure 226, forming the etch stop structure 240 in the circumferential through opening by introducing a filling material structure that is resistant to the etching process into the circumferential through opening, and forming the first layer structure on the sacrificial material 232 and the etch stop structure 240.

In accordance with a thirteenth aspect referring to the twelfth aspect, in the production method 100, the further etch stop structure 340 can be arranged as a further, circumferential edge region around the further exposure region 330-1.

In accordance with a fourteenth aspect referring to the thirteenth aspect, the production method 100 can furthermore comprise the following step: forming the further etch stop structure 241 by introducing a layer sequence composed of a plurality of filling materials into a further, circumferential through opening.

In accordance with a fifteenth aspect referring to the tenth aspect, in the production method 100, the first circumferential etch stop structure 240 in the first intermediate region 230 and the second circumferential etch stop structure 241 in the further intermediate region 330 can be arranged in a manner laterally offset with respect to one another.

In accordance with a sixteenth aspect, a MEMS component 200 can comprise the following features: a layer arrangement 220 on a carrier substrate, wherein the layer arrangement 220 comprises a first and second layer structure 224, 226, wherein an exposure region is exposed between the first and second layer structures 224, 226, wherein a sacrificial material is arranged in an edge region 230-2 between the first and second layer structures 224, 226, wherein an etchant-resistant wall structure 240, 241, 340 extending between the first and second layer structures 224, 226 demarcates the exposure region 230-1 from the edge region 230-2 laterally adjoining the latter, and wherein the insulation material present in the edge region is effective for mechanical connection between the first and second layer structures 224, 226.

In accordance with a seventeenth aspect referring to the sixteenth aspect, in the MEMS component 200, the etchant-resistant wall structure 240, 241, 340 can be arranged as a circumferential edge region around the exposure region 230-1.

In accordance with an eighteenth aspect referring to the sixteenth aspect, in the MEMS component 200, the layer arrangement 220 can comprise in the exposure region 230-1 an additional etchant-resistant wall structure 241 arranged between the first and second layer structures 224, 226.

In accordance with a nineteenth aspect referring to the sixteenth aspect, in the MEMS component 200, the first layer structure 224 can be configured as a rigid counterelectrode structure, and the second layer structure 226 can be configured as a deflectable membrane structure.

In accordance with a twentieth aspect referring to the sixteenth aspect, in the MEMS component 200, the layer arrangement 220 can comprise a third layer structure 322, wherein a further exposure region is exposed between the second and third layer structures 226, 322, wherein an insulation material is arranged in a further edge region 330-2 between the second and third layer structures 226, 322, wherein an etchant-resistant wall structure 340 extending between the second and third layer structures 226, 322 demarcates the further exposure region from the further edge region 330-2 laterally adjoining the latter, wherein the insulation material present in the further edge region 330-2 is effective for mechanical connection between the second and third layer structures 226, 322.

In accordance with a twenty-first aspect referring to the twentieth aspect, in the MEMS component 200, the further etchant-resistant wall structure 340 can be arranged as a further, circumferential edge region around the further exposure region 330-1 between the second and third layer structures 226, 322.

In accordance with a twenty-second aspect referring to the twentieth aspect, in the MEMS component 200, the further etchant-resistant wall structure 340 can comprise a further layer sequence composed of a plurality of filling material layers.

In accordance with a twenty-third aspect referring to the sixteenth aspect, in the MEMS component 200, the etchant-resistant circumferential wall structure 240 adjoining the exposure region 230-1 and the further, circumferential etchant-resistant wall structure 340 adjoining the further edge region 330-2 can be arranged in a manner laterally offset with respect to one another.

In accordance with a twenty-fourth aspect referring to the sixteenth aspect, in the MEMS component 200, the first and third layer structures 224, 322 can be configured as counterelectrode structures, and the second layer structure 226 can be configured as a deflectable membrane structure between the counterelectrode structures.

In accordance with a twenty-fifth aspect referring to the sixteenth aspect, in the MEMS component 300, the first and third layer structures 224, 322 can be configured as a first and second membrane structure, and the second layer structure 226 can be configured as a counterelectrode structure arranged between the first and second membrane structures.

Although some aspects have been described in association with a device, it goes without saying that these aspects also constitute a description of the corresponding method, such that a block or a component of a device should also be understood as a corresponding method step or as a feature of a method step. Analogously thereto, aspects that have been described in association with, or as a method step also constitute a description of a corresponding block or detail or feature of a corresponding device.

The exemplary embodiments described above merely represent an illustration of the principles of the present invention. It goes without saying that modifications and variations of the arrangements and details described herein will become apparent to others skilled in the art. Therefore, the intention is for the invention to be restricted only by the scope of protection of the appended patent claims and not by the specific details that have been presented on the basis of the description and the explanation of the exemplary embodiments herein.

What is claimed is:

1. A production method for a MEMS component comprising the following steps:
   providing a layer arrangement on a carrier substrate, wherein providing the layer arrangement comprises forming a first and second layer structure, wherein a sacrificial material is formed in an intermediate region between the first and second layer structures, wherein an etch stop structure is formed extending between the first and second layer structures that subdivides the intermediate region into an exposure region and an edge region laterally adjoining the exposure region, and wherein at least one of the first layer structure or the second layer structure is formed with access openings to the exposure region, and
   removing the sacrificial material from the exposure region through the access openings using an etching process to expose the exposure region, wherein the etch stop structure provides a lateral delimitation for the etching process, and wherein, after removing the sacrificial material from the exposure region, the sacrificial material present in the edge region provides a mechanical connection between the first and second layer structures.

2. The production method as claimed in claim 1, wherein the etch stop structure is arranged as a circumferential edge region around the exposure region in the layer arrangement.

3. The production method as claimed in claim 1, wherein the layer arrangement comprises in the intermediate region an additional closed etch stop structure extending between the first and second layer structures.

4. The production method as claimed in claim 1, wherein before the step of providing the layer arrangement the following steps for forming the layer arrangement are performed:
   forming the second layer structure on the carrier substrate;
   applying sacrificial material on the second layer structure;
   introducing a circumferential through opening into the sacrificial material as far as the second layer structure;
   forming the etch stop structure in the circumferential through opening by introducing a filling material structure that is resistant to the etching process into the circumferential through opening; and
   forming the first layer structure on the sacrificial material and the etch stop structure.

5. The production method as claimed in claim 4, further comprising forming the etch stop structure by introducing a layer sequence composed of a plurality of filling materials into the circumferential through opening.

6. The production method as claimed in claim 4, further comprising:
   introducing an additional through opening into the sacrificial material as far as the second layer structure; and
   forming an additional etch stop structure in the additional through opening by introducing an additional filling material structure that is resistant to the etching process into the additional through opening.

7. The production method as claimed in claim 1, wherein the step of removing the sacrificial material is performed using an anisotropic etching process using an etchant, wherein the etchant has an etching rate that is higher for the sacrificial material than for a material of the etch stop structure at least by a factor of 10.

8. The method as claimed in any claim 1, wherein the first layer structure is configured as a counterelectrode structure, and wherein the second layer structure is configured as a deflectable membrane structure.

9. The production method as claimed in claim 1, wherein the first layer structure is configured as a deflectable membrane structure, and wherein the second layer structure is configured as a counterelectrode structure.

10. The production method as claimed in claim 1, wherein the layer arrangement comprises a third layer structure, wherein a further sacrificial material is arranged in a further intermediate region between the second and third layer structures, and wherein the third layer structure has further access openings to a further exposure region; and wherein the further sacrificial material is removed from the further exposure region through the further access openings using the etching process to expose the further exposure region.

11. The production method as claimed in claim 10, wherein a further etch stop structure is arranged between the second and third layer structures, which further etch stop structure subdivides the further intermediate region into a further exposure region and a further edge region laterally adjoining the further exposure region; and wherein the further etch stop structure provides a lateral delimitation for the etching process, and wherein the sacrificial material remaining in the further edge region provides a mechanical connection between the second and third layer structures.

12. The production method as claimed in claim 11, wherein before step of providing the layer arrangement the following steps for forming the layer arrangement are performed:

forming the third layer structure on the carrier substrate, applying sacrificial material on the third layer structure;
introducing a further circumferential through opening into the sacrificial material as far as the third layer structure;
forming the further etch stop structure in the further circumferential through opening by introducing a further filling material structure that is resistant to the etching process into the further circumferential through opening;
forming the second layer structure on the sacrificial material and the further etch stop structure;
applying sacrificial material on the second layer structure;
introducing a circumferential through opening into the sacrificial material as far as the second layer structure;
forming the etch stop structure in the circumferential through opening by introducing a filling material structure that is resistant to the etching process into the circumferential through opening; and
forming the first layer structure on the sacrificial material and the etch stop structure.

13. The production method as claimed in claim 12, wherein the further etch stop structure is arranged as a further, circumferential edge region around the further exposure region.

14. The production method as claimed in claim 13, furthermore comprising forming the further etch stop structure by introducing a layer sequence including of a plurality of filling materials into the further, circumferential through opening.

15. The production method as claimed in claim 10, wherein a first circumferential etch stop structure in the intermediate region and a second circumferential etch stop structure in the further intermediate region are arranged in a manner laterally offset with respect to one another.

16. A MEMS component comprising:

a layer arrangement on a carrier substrate, wherein the layer arrangement comprises a first and second layer structure, wherein an exposure region is exposed between the first and second layer structures, wherein a sacrificial material is arranged only in an edge region between the first and second layer structures, wherein an etchant-resistant wall structure extending between the first and second layer structures demarcates the exposure region from the edge region laterally adjoining the exposure region, and wherein insulation material and the sacrificial material present in the edge region provides a mechanical connection between the first and second layer structures.

17. The MEMS component as claimed in claim 16, wherein the etchant-resistant wall structure is arranged as a circumferential edge region around the exposure region.

18. The MEMS component as claimed in claim 16, wherein the layer arrangement comprises in the exposure region an additional etchant-resistant wall structure arranged between the first and second layer structures.

19. The MEMS component as claimed in claim 16, wherein the first layer structure is configured as a rigid counterelectrode structure, and wherein the second layer structure is configured as a deflectable membrane structure.

20. The MEMS component as claimed in claim 16, wherein the layer arrangement comprises a third layer structure, wherein a further exposure region is exposed between the second and third layer structures, wherein an insulation material is arranged in a further edge region between the second and third layer structures, wherein an etchant-resistant wall structure extending between the second and third layer structures demarcates the further exposure region from the further edge region laterally adjoining the exposure region, and wherein the insulation material present in the further edge region provides a mechanical connection between the second and third layer structures.

21. The MEMS component as claimed in claim 20, wherein a further etchant-resistant wall structure is arranged as a further circumferential edge region around the further exposure region between the second and third layer structures.

22. The MEMS component as claimed in claim 21, wherein the further etchant-resistant wall structure comprises a further layer sequence composed of a plurality of filling material layers.

23. The MEMS component as claimed in claim 20, wherein an etchant-resistant circumferential wall structure adjoining the exposure region and a further circumferential etchant-resistant wall structure adjoining the further edge region are arranged in a manner laterally offset with respect to one another.

24. The MEMS component as claimed in claim 20, wherein the first and third layer structures are configured as counterelectrode structures, and wherein the second layer structure is configured as a deflectable membrane structure between the counterelectrode structures.

25. The MEMS component as claimed in claim 20, wherein the first and third layer structures are configured as a first and second membrane structure, and wherein the second layer structure is configured as a counterelectrode structure arranged between the first and second membrane structures.

* * * * *